(12) United States Patent
Ohara

(10) Patent No.: US 7,698,661 B2
(45) Date of Patent: Apr. 13, 2010

(54) CIRCUIT AUTOMATIC GENERATION APPARATUS AND METHOD

(75) Inventor: Yasushi Ohara, Yokohama (JP)

(73) Assignee: Panasonic Corporation, Osaka (JP)

( * ) Notice: Subject to any disclaimer, the term of this patent is extended or adjusted under 35 U.S.C. 154(b) by 372 days.

(21) Appl. No.: 11/370,010

(22) Filed: Mar. 8, 2006

(65) Prior Publication Data

US 2006/0218454 A1 Sep. 28, 2006

(30) Foreign Application Priority Data

Mar. 8, 2005 (JP) .......................... P2005-064089
Sep. 2, 2005 (JP) .......................... P2005-255054

(51) Int. Cl.
*G06F 17/50* (2006.01)
(52) U.S. Cl. ................... 716/1; 716/4; 716/18
(58) Field of Classification Search ................. 716/4–6, 716/8, 1, 18
See application file for complete search history.

(56) References Cited

U.S. PATENT DOCUMENTS

| | | | | |
|---|---|---|---|---|
| 6,405,355 | B1* | 6/2002 | Duggirala et al. | 716/8 |
| 6,615,392 | B1* | 9/2003 | Nadeau-Dostie et al. | 716/5 |
| 6,766,501 | B1* | 7/2004 | Duggirala et al. | 716/11 |
| 6,839,873 | B1* | 1/2005 | Moore | 714/725 |
| 6,948,105 | B2* | 9/2005 | Rajsuman | 714/724 |
| 7,181,705 | B2* | 2/2007 | Dervisoglu et al. | 716/4 |
| 2002/0073380 | A1* | 6/2002 | Cooke et al. | 716/1 |
| 2003/0149949 | A1* | 8/2003 | Price et al. | 716/4 |

(Continued)

FOREIGN PATENT DOCUMENTS

JP 6-274558 9/1994

(Continued)

OTHER PUBLICATIONS

Front page of Japanese Office Action issued in Japanese Patent Application No. JP 2005-255054 dated Nov. 17, 2009.

*Primary Examiner*—Thuan Do
*Assistant Examiner*—Nha T Nguyen
(74) *Attorney, Agent, or Firm*—McDermott Will & Emery LLP

(57) ABSTRACT

A circuit automatic generation apparatus includes storage means 4 for retaining input/output information of each function circuit and circuit information to which the function circuit is connected, test mode generation specifications for generating a test mode signal, test specifications added to the function circuit, terminal test specifications for specifying the input/output directions of terminals and circuit terminal information to which the terminals are connected, and input/output information of a top-layer circuit and circuit information to which the top-layer circuit is connected; connection information check means 5 for determining the presence or absence of a connection defect of the function circuit; test mode generation circuit generation means 10 for generating a test mode generation circuit; test specification addition function circuit generation means 9 for generating a function circuit to which test specifications are added; terminal test circuit generation means 11 for generating a terminal test circuit; and top-layer circuit generation means 8 for generating the top-layer circuit from the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

14 Claims, 18 Drawing Sheets

U.S. PATENT DOCUMENTS

| | | |
|---|---|---|
| 2004/0139409 A1 | 7/2004 | Nagasawa et al. |
| 2004/0172605 A1* | 9/2004 | Kuge et al. ..................... 716/1 |
| 2005/0039154 A1* | 2/2005 | Nguyen et al. ................ 716/13 |
| 2005/0071787 A1* | 3/2005 | Koga et al. ..................... 716/1 |
| 2006/0027919 A1* | 2/2006 | Ali et al. ..................... 257/734 |

FOREIGN PATENT DOCUMENTS

| | | |
|---|---|---|
| JP | 2927137 | 5/1999 |
| JP | 2002-056041 | 2/2002 |
| JP | 2004-213301 | 7/2004 |
| JP | 2004-280279 A | 10/2004 |

* cited by examiner

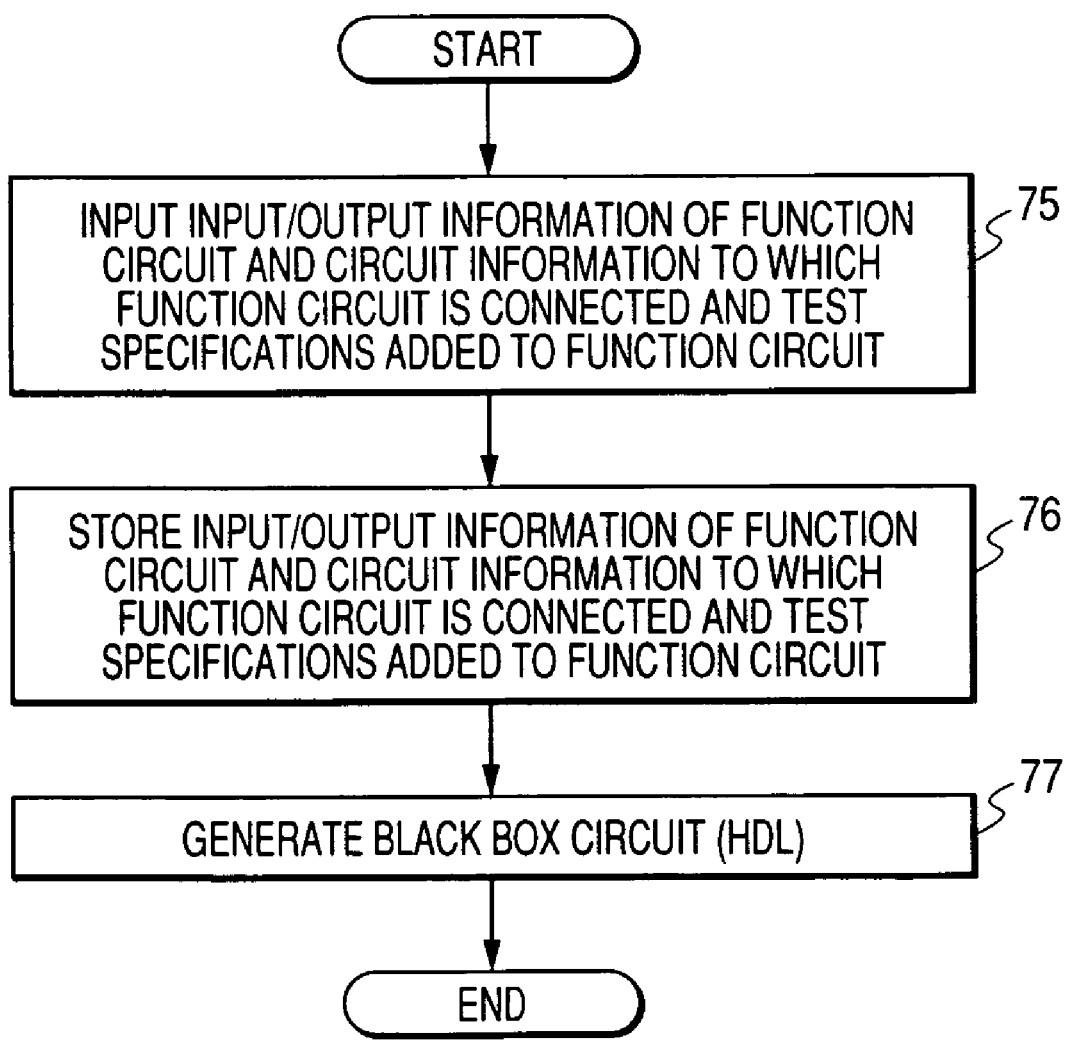

CIRCUIT AUTOMATIC GENERATION APPARATUS AND METHOD

BACKGROUND OF THE INVENTION

1. Field of the Invention

This invention relates to an automatic design technology of a semiconductor integrated circuit described in an HDL (Hardware Description Language) and in particular to a circuit automatic generation apparatus and method unifying a large number of design steps required for creating the top-layer circuit of a semiconductor integrated circuit.

2. Description of the Related Art

Hitherto, a method of automatically generating a logical circuit from a circuit described in the HDL using a logic synthesis tool has been adopted widely as a method of generating a logical circuit of a semiconductor integrated circuit. However, it is a common practice for a designer to manually describe a circuit using a text editor, etc., as a method of describing a circuit in the HDL.

A top down design technique of dividing a semiconductor integrated circuit for each function to form a hierarchical (layered) organization is widely used as a circuit design technique of describing a circuit in the HDL in the related art; a circuit is designed according to the hierarchical (layered) organization technique in function circuit design and in top-layer circuit design of a semiconductor integrated circuit. In the hierarchical (layered) design technique, it is necessary to create a high-layer circuit for connecting input/output signals of a plurality of function circuits formed as low layers.

In recent years, the number of function circuits making up a semiconductor integrated circuit has become enormous with the larger scale and higher function of the semiconductor integrated circuit. To develop such a semiconductor integrated circuit early, the trend of dividing design work among designers for each function circuit appears noticeably. The design process of creating the top-layer circuit of a semiconductor integrated circuit tends to be divided among designers.

To create the top-layer circuit, "input/output information of function circuit," "circuit information to which function circuit is connected," and "input/output information of top-layer circuit and circuit information to which top-layer circuit is connected" become necessary.

To create a top-layer circuit closer to the mounting level to which test specifications to conduct shipment inspection of a semiconductor integrated circuit are added, further "test mode signal generation information," "terminal test specification information," and "function block circuit information to which test specifications are added" become necessary. These pieces of information are information dependent on the job progress situation of function circuit designers, and are frequently updated.

In a general work dividing system, a design review is conducted for each job in charge and a check is made to ensure that the circuit does not involve any problem and then the job is inherited to the next step. In this method, however, a large number of steps are undergone until completion of a sequence of jobs, and it takes much time until a product high in perfection is obtained in the job in which the correction frequency is high.

The design method of creating the top-layer circuit of a semiconductor integrated circuit is conducted, for example, in the order of "function circuit creation," "test mode signal generation circuit creation," "terminal test circuit creation," "test circuit installation in function circuit," "top-level circuit creation," and "whole circuit design check of top-layer circuit of semiconductor integrated circuit."

In the design process, if trouble occurs in the last step "whole circuit design check of top-layer circuit of semiconductor integrated circuit," the process returns to the first "function circuit creation" step and a correction is made. In the design process, there is a possibility that a large number of artificial mistakes may occur such as a mistake at the circuit creation time and a design data pass mistake to the next step caused by the fact that a plurality of designers manually work in each step.

Thus, in the design method of creating the top-layer circuit in the related art, a plurality of designers manually work in each design step and thus the time taken for the design step is prolonged and an artificial mistake also occurs frequently and therefore a great deal of time is wasted as manual return is repeated.

Some semiconductor integrated circuits for mobile communications include a mechanism for dividing power supplied to the semiconductor integrated circuit into two or more channels and supplying or shutting off the power as required to realize low power consumption. In this mechanism, a state occurs in which a semiconductor element to which power is supplied and a semiconductor element to which no power is supplied are mixed according to the power supply and power shutoff combination of the two or more channels.

At this time, if a function circuit to which power is supplied receives output data of a function circuit to which no power is supplied as input, the input gate potential of the semiconductor element is not fixed and thus a leakage current flows.

To prevent a leakage current from flowing in design, it is necessary to create a power supply control signal and install a circuit for fixing the function circuit input potential in response to the power supply control specifications.

As an example of such a power supply control mechanism, a method of inputting a power supply control signal designed in response to the power supply control specifications to a function circuit as input signal and installing an AND gate for the input signal to the function circuit is available.

The design step of creating the power supply control circuit also tends to be divided among workers.

However, the design step is also conducted manually by a plurality of designers and thus the time taken for the design step is prolonged and an artificial mistake also occurs frequently and therefore a great deal of time is wasted as manual return is repeated.

In function verification of a semiconductor integrated circuit, function verification is conducted in response to the function to be checked. To conduct function verification, input data dynamically changing with input of a semiconductor integrated circuit (real values of high level, low level, intermediate potential, undefined value, etc.,) is input using a function verification tool and each function circuit is operated and the result is output. A comparison is made between the output result and the expectation value data previously describing the operation expected as the semiconductor integrated circuit specifications, whereby whether the function circuit operates normally or malfunctions can be checked.

The designer selects execution of function verification for each function circuit or in the one-chip circuit containing all function circuits considering the work efficiency in response to the check items of the function verification. In the one-chip circuit function verification of a large-scaled semiconductor integrated circuit, the handled data amount tends to become very large.

Particularly, in the one-chip circuit function verification, the used input data and expectation value data increase depending on the product of the number of terminals and the number of modes of the semiconductor integrated circuit and therefore the creation work of the input data and the expectation value data requires a great deal of time.

The input data and the expectation value data used for the function verification tend to be created manually by a plurality of designers.

Since the design steps involved in the function verification are also conducted manually by a plurality of designers, the time taken for the design steps is prolonged and an artificial mistake also occurs frequently and therefore a great deal of time is wasted as manual return is repeated.

As a related art for shortening the circuit design time period, Japanese Patent No. 2927137 discloses a design automation art of storing data defining the external specifications about already designed function circuits and put into parts and inputting the external specifications of the circuit to be designed and the circuit configuration, thereby reusing the already designed function circuits.

According to the art, after function circuit design completion, the function circuit and the input/output test specifications of the function circuit are given as input data and a test circuit is installed in the function circuit for conversion of the function circuit to the function circuit to which the test specifications are added, whereby the "test circuit installation in function circuit" step can be speeded up.

According to the art, however, only the "test circuit installation in function circuit" step is speeded up in the step sequence of creating the top-layer circuit and occurrence of waste of a great deal of time as manual return is repeated is not circumvented and therefore it is impossible to drastically reduce the number of design steps of a semiconductor integrated circuit.

To create the top-layer circuit rapidly and with no mistake, it is necessary to radically remedy "existence of a large number of design steps to create the top-layer circuit" and "manual work of a plurality of designers as work in each step" of the design method problems in the related arts.

To create the power supply control circuit rapidly and with no mistake in the power supply control circuit installation step, it is also necessary to radically remedy "manual work of a plurality of designers" of the design method problem in the related art.

In the step of creating the input data and the expectation value data used for the function verification, it is also necessary to radically remedy "manual work of a plurality of designers" of the design method problem in the related art.

SUMMARY OF THE INVENTION

It is an object of the invention to provide a circuit automatic generation apparatus and method for making it possible to unify a large number of design steps required for creating the top-layer circuit of a semiconductor integrated circuit and automatically create the top-layer circuit simply by inputting circuit specifications. It is another object of the invention to automatically generate a power supply control circuit and input data and expectation value data used for function verification.

According to the invention, there is provided a circuit automatic generation apparatus of a semiconductor integrated circuit for connecting signals of a plurality of function circuits to generate a top-layer circuit, the circuit automatic generation apparatus including means for retaining input/output information of each of the function circuits and circuit information to which each of the function circuits is connected, test mode generation specifications for generating a test mode signal to identify a plurality of operation modes containing the usual operation time and the test operation time, test specifications added to each of the function circuits, terminal test specifications for specifying the input/output directions of terminals and circuit terminal information to which the terminals are connected in response to the test mode signal, and input/output information of the top-layer circuit and circuit information to which the top-layer circuit is connected; means for collating the signal connection relationship of the function circuit and determining the presence or absence of a connection defect; means for generating a test mode generation circuit in response to the test mode generation specifications; means for generating a function circuit to which test specifications are added in response to the test specifications added to the function circuit; means for generating a terminal test circuit in response to the terminal test specifications; and means for generating the top-layer circuit from the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

According to the described configuration, all information required for creating the top-layer circuit containing the test relevant specifications of test mode signal generation, terminal control responsive to the test mode signal, and the test specifications added to the function circuit is given, so that integrity of circuit information in the test mode generation circuit and the terminal test circuit newly created according to the test specifications and the function circuit to which the test specifications are added is kept and a large number of design steps are unified. Thus, the problems in the related arts such as "existence of a large number of design steps to create the top-layer circuit" and "manual work of a plurality of designers as work in each step" can be solved and the connection information is checked simply by inputting the circuit specifications and then the top-layer circuit is generated, so that long-hour work and waste of a great deal of time as manual return is repeated in the design steps in the related arts can be circumvented and a high-quality product can be designed efficiently.

In the top down design technique described in the HDL, not only the top-layer circuit, but also a high-layer circuit is created by connecting the signals of a plurality of function circuits in response to the specifications, whereby the circuit is designed as a hierarchical (layered) structure wherein the high-layer circuit governs the function circuits.

According to the invention, there is provided a circuit automatic generation apparatus of a semiconductor integrated circuit for connecting signals of a plurality of function circuits to generate a high-layer circuit, the circuit automatic generation apparatus including means for retaining input/output information of each of the function circuits and circuit information to which each of the function circuits is connected and input/output information of the high-layer circuit and circuit information to which the high-layer circuit is connected; means for collating the signal connection relationship of the function circuit and determining the presence or absence of a connection defect; and means for generating the high-layer circuit from the input/output information of the function circuit and circuit information to which the function circuit is connected and the input/output information of the high-layer circuit and circuit information to which the high-layer circuit is connected.

According to the described configuration, all information required for creating the high-layer circuit of the function circuit is input data, so that integrity of circuit information is kept and the input data can be corrected according to the connection relationship determination result of the function circuit, so that a connection mistake can be corrected before the circuit is automatically generated and the high-layer circuit free of a connection error, etc., can be generated in a short time.

The circuit automatic generation apparatus of the invention further includes means for retaining test mode priority specifications for specifying the priority of the operation modes, wherein when configuring a selection circuit of a signal output to the terminal, the means for generating a terminal test circuit configures the selection circuit so that circuits become higher-speed circuits in the descending order of the priority levels of the operation modes from the high priority to the low priority.

According to the described configuration, when a selection circuit of a signal output to the terminal in response to the test specifications is inserted, the selection circuit is configured so that circuits become higher-speed circuits in the descending order of the priority levels of the operation modes from the high priority to the low priority and thus the terminal test circuit considering the AC timing desired as the specifications is generated without worsening the AC timing in the usual mode.

The circuit automatic generation apparatus of the invention further includes means for retaining terminal test circuit division specifications for specifying a division method of the terminal test circuit, wherein the means for generating a terminal test circuit generates terminal test circuits into which one terminal test circuit is divided in response to the terminal test specifications and the terminal test circuit division specifications According to the described configuration, the terminal test circuit can be divided as desired and each divided terminal test circuit can be placed in the proximity of the relevant terminal. Thus, if the AC timing of the terminal test circuit is severe, the AC timing can be eased and worsening the AC timing because of a wiring detour is prevented and an increase in the area of the semiconductor integrated circuit caused by routing of wiring can also be prevented.

The circuit automatic generation apparatus of the invention further includes means for retaining combining mode generation specifications of combining power supply control specifications for specifying a power supply control method to semiconductor elements for each of power supply channels into which one power supply channel is divided, of the semiconductor integrated circuit and the test mode generation specifications; means for generating a combining mode generation circuit in response to the combining mode generation specifications; and means for generating a test specification and power supply specification addition function circuit from the combining mode generation specifications and the input/output information of the function circuit and circuit information to which the function circuit is connected.

According to the described configuration, the combining mode generation circuit and the test specification and power supply specification addition function circuit are generated in response to the combining mode generation specifications and the input/output information of the function circuit and circuit information to which the function circuit is connected, whereby power supply to semiconductor elements for each of power supply channels into which one power supply channel is divided, of the semiconductor integrated circuit can be controlled together with the test mode generation specifications.

In the circuit automatic generation apparatus of the invention, the means for collating the signal connection relationship of the function circuit and determining the presence or absence of a connection defect generates the determination result of the presence or absence of a connection defect and a connection determination result summary as a summary of the determination result of the presence or absence of a connection defect for each function circuit.

According to the described configuration, a connection determination result summary as a summary of the determination result of the presence or absence of a connection defect for each function circuit is generated, so that observation of the determination result is improved and the correction can be fed back rapidly.

The circuit automatic generation apparatus of the invention further includes means for retaining added specifications describing corrections to be made to the input/output information of the function circuit and circuit information to which the function circuit is connected, the test mode generation specifications, the test specifications added to the function circuit, the terminal test specifications, etc., wherein the means for generating the top-layer circuit generates the top-layer circuit from the test mode generation specifications, the terminal test specifications, the input/output information of the function circuit and circuit information to which the function circuit is connected, the test specifications added to the function circuit, the input/output information of the top-layer circuit and circuit information to which the top-layer circuit is connected, and the added specifications.

According to the described configuration, even if the input/output information of the function circuit and circuit information to which the function circuit is connected, the test mode generation specifications, the test specifications added to the function circuit, the terminal test specifications, etc., cannot be corrected, the data is retained as original data and the added specifications describing the corrections to be made to the original data are given, whereby the top-layer circuit can be generated based on the corrected original data.

The circuit automatic generation apparatus of the invention further includes means for automatically generating input data and expectation value data to verify the semiconductor integrated circuit in response to the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

According to the described configuration, the input data and the expectation value data input to the top-layer circuit, the function circuit, and the test circuit required for executing function verification of the semiconductor integrated circuit can be generated, so that the time taken for creating the input data and the expectation value data can be reduced.

The circuit automatic generation apparatus of the invention further includes means for generating a black box circuit to which function verification is not applied when the semiconductor integrated circuit is verified in response to the input/output information of the function circuit and circuit information to which the function circuit is connected and the test specifications added to the function circuit.

According to the described configuration, a function circuit to which function verification is not applied can be easily put into a black box in response to the function verification item, and the function verification time can be shortened.

According to the invention, there is provided a circuit automatic generation method of a semiconductor integrated-circuit for connecting signals of a plurality of function circuits to generate a top-layer circuit, the circuit automatic generation method including the steps of collating the signal connection relationship of the function circuit and determining the presence or absence of a connection defect; generating a test mode generation circuit in response to test mode generation specifications for generating a test mode signal to identify a plurality of operation modes containing the usual operation time and the test operation time; generating a function circuit to which test specifications are added in response to the test specifications added to the function circuit; generating a terminal test circuit in response to terminal test specifications for specifying input/output directions of terminals and circuit terminal information to which the terminals are connected in response to the test mode signal; and generating the top-layer circuit from the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

According to the described configuration, all information required for creating the top-layer circuit containing the test relevant specifications is given, so that integrity of circuit information in the test mode generation circuit and the terminal test circuit newly created according to the test specifications and the function circuit to which the test specifications are added is kept and a large number of design steps are unified. Thus, the problems in the related arts can be solved and the connection information is checked simply by inputting the circuit specifications and then the top-layer circuit is generated, so that long-hour work and waste of a great deal of time as manual return is repeated in the design steps in the related arts can be circumvented and a high-quality product can be designed efficiently.

According to the invention, there is provided a circuit automatic generation method of a semiconductor integrated circuit for connecting signals of a plurality of function circuits to generate a high-layer circuit, the circuit automatic generation method including the steps of collating the signal connection relationship of the function circuit and determining the presence or absence of a connection defect; and generating the high-layer circuit from the input/output information of the function circuit and circuit information to which the function circuit is connected and the input/output information of the high-layer circuit and circuit information to which the high-layer circuit is connected.

According to the described configuration, all information required for creating the high-layer circuit of the function circuit is input data, so that integrity of circuit information is kept and the input data can be corrected according to the connection relationship determination result of the function circuit, so that a connection mistake can be corrected before the circuit is automatically generated and the high-layer circuit free of a connection error, etc., can be generated in a short time.

The circuit automatic generation method of the invention further includes the step of inputting test mode priority specifications for specifying the priority of the operation modes, wherein when configuring a selection circuit of a signal output to the terminal, the step of generating a terminal test circuit configures the selection circuit so that circuits become higher-speed circuits in the descending order of the priority levels of the operation modes from the high priority to the low priority.

According to the described configuration, when a selection circuit of a signal output to the terminal in response to the test specifications is inserted, the selection circuit is configured so that circuits become higher-speed circuits in the descending order of the priority levels of the operation modes from the high priority to the low priority and thus the terminal test circuit considering the AC timing desired as the specifications is generated without worsening the AC timing in the usual mode.

The circuit automatic generation method of the invention further includes the step of inputting terminal test circuit division specifications for specifying a division method of the terminal test circuit, wherein the step of generating a terminal test circuit generates terminal test circuits into which one terminal test circuit is divided in response to the terminal test specifications and the terminal test circuit division specifications.

According to the described configuration, the terminal test circuit can be divided as desired and each divided terminal test circuit can be placed in the proximity of the relevant terminal. Thus, if the AC timing of the terminal test circuit is severe, the AC timing can be eased and worsening the AC timing because of a wiring detour is prevented and an increase in the area of the semiconductor integrated circuit caused by routing of wiring can also be prevented.

The circuit automatic generation method of the invention further includes the steps of generating a combining mode generation circuit in response to combining mode generation specifications of combining power supply control specifications for specifying a power supply control method to semiconductor elements for each of power supply channels into which one power supply channel is divided, of the semiconductor integrated circuit and the test mode generation specifications; and generating a test specification and power supply specification addition function circuit from the combining mode generation specifications and the input/output information of the function circuit and circuit information to which the function circuit is connected.

According to the described configuration, the high-quality combining mode generation circuit and the high-quality test specification and power supply specification addition function circuit can be generated in a short time in response to the combining mode generation specifications and the input/output information of the function circuit and circuit information to which the function circuit is connected.

In the circuit automatic generation method of the invention, the step of collating the signal connection relationship of the function circuit and determining the presence or absence of a connection defect generates the determination result of the presence or absence of a connection defect and a connection determination result summary as a summary of the determination result of the presence or absence of a connection defect for each function circuit.

According to the described configuration, a connection determination result summary as a summary of the determination result of the presence or absence of a connection defect for each function circuit is generated, so that observation of the determination result is improved and the correction can be fed back rapidly.

The circuit automatic generation method of the invention further includes the step of inputting added specifications describing corrections to be made to the input/output information of the function circuit and circuit information to which the function circuit is connected, the test mode generation specifications, the test specifications added to the function circuit, the terminal test specifications, etc., wherein the step of generating the top-layer circuit generates the top-layer circuit from the test mode generation specifications, the terminal test specifications, the input/output information of the function circuit and circuit information to which the function circuit is connected, the test specifications added to the function circuit, the input/output information of the top-layer circuit and circuit information to which the top-layer circuit is connected, and the added specifications describing the corrections to be made to the input/output information of the function circuit and circuit information to which the function circuit is connected, the test mode generation specifications, the test specifications added to the function circuit, the terminal test specifications, etc.

According to the described configuration, even if the input/output information of the function circuit and circuit information to which the function circuit is connected, the test mode generation specifications, the test specifications added to the function circuit, the terminal test specifications, etc., cannot be corrected, the high-quality top-layer circuit can be generated in a short time in response to the added specifications.

The circuit automatic generation method of the invention further includes the step of generating input data and expectation value data to verify the semiconductor integrated circuit in response to the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

According to the described configuration, the input data and the expectation value data input to the top-layer circuit, the function circuit, and the test circuit required for executing function verification of the semiconductor integrated circuit can be easily generated, so that the time taken for creating the high-quality input data and the high-quality expectation value data can be created in a short time.

The circuit automatic generation method of the invention further includes the step of generating a black box circuit to which function verification is not applied when the semiconductor integrated circuit is verified in response to the input/output information of the function circuit and circuit information to which the function circuit is connected and the test specifications added to the function circuit.

According to the described configuration, a function circuit to which function verification is not applied can be easily put into a black box in response to the function verification item, and the function verification time can be shortened.

According to the invention, all information required for creating the top-layer circuit containing the test relevant specifications is given and the integrity of the circuit connection information is checked based on the information and the top-layer circuit, the mode specification addition function circuit including the power supply control specifications, the mode generation circuit, and the input data and the expectation value data used for function verification are automatically generated in a short time, whereby a large number of design steps are unified and the problems in the related arts of long-hour work and waste of a great deal of time as manual return is repeated in the design steps in the related arts can be circumvented and a high-quality product can be designed efficiently.

BRIEF DESCRIPTION OF THE DRAWINGS

FIG. 18 is a flowchart to show the processing process of a circuit automatic generation method in a seventeenth embodiment of the invention.

DESCRIPTION OF THE PREFERRED EMBODIMENTS

First Embodiment

Figure 1:
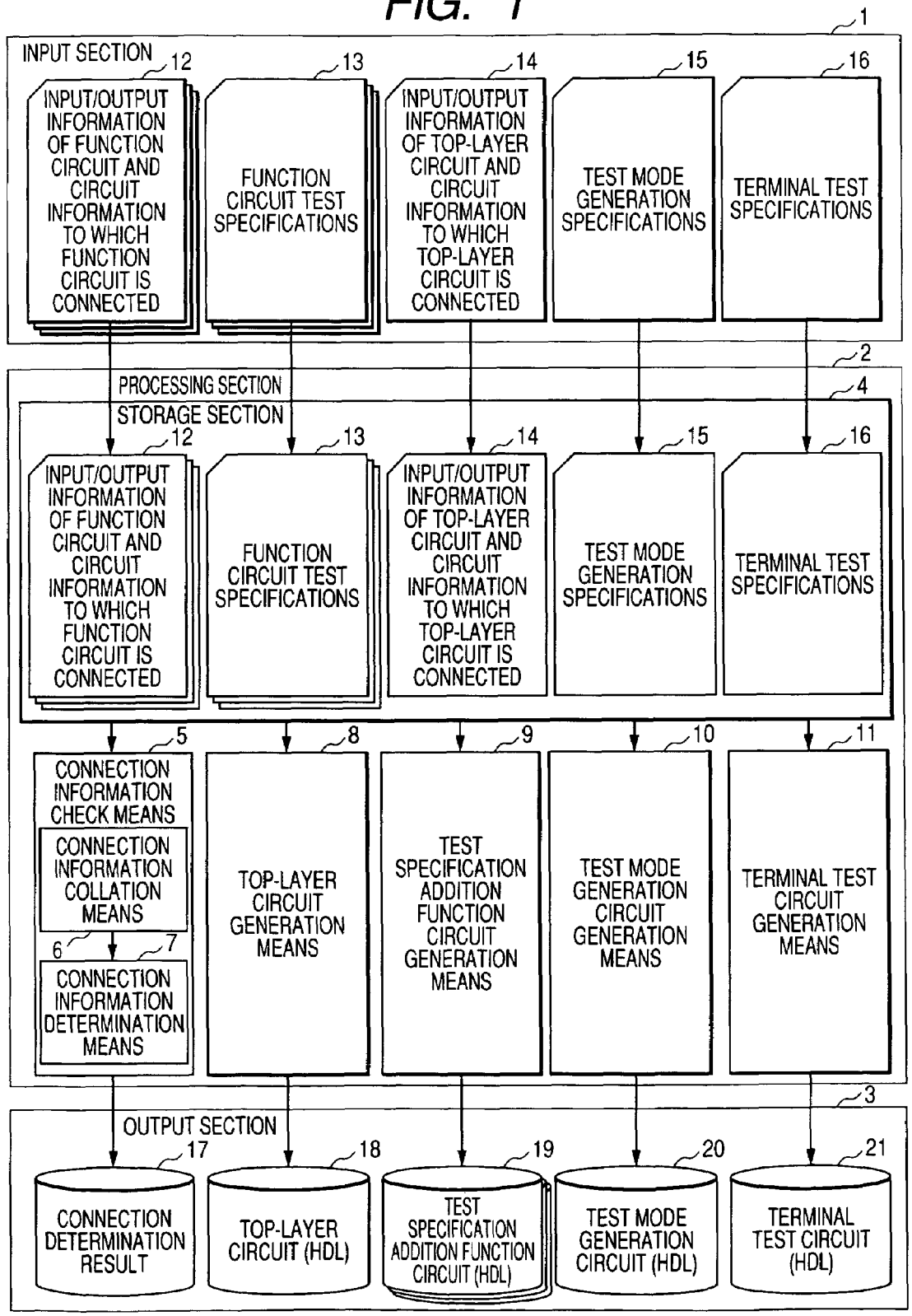
FIG. 1 is a block diagram to show the configuration of a circuit automatic generation apparatus in a first embodiment of the invention.

FIG. 1 is a diagram to show the basic concept of a circuit automatic generation apparatus in a first embodiment of the invention. The circuit automatic generation apparatus of the embodiment automatically generates a top-layer circuit based on HDL description syntax by inputting generation specifications of a test mode signal for controlling a semiconductor integrated circuit, terminal test specifications for controlling terminals by a test mode signal, input/output information of function circuit and circuit information to which function circuit is connected, test specifications added to each function circuit, and input/output information of the top-layer circuit and circuit information to which the top-layer circuit is connected to an input section.

However, if input/output signals of the function circuits are connected erroneously on the top layer, malfunction occurs as a semiconductor integrated device and therefore connection information check means capable of checking circuit trouble such as "input open" or "output short" before the top-layer circuit is created is installed. If circuit trouble occurs, the circuit specifications or the test specifications input to the input section are corrected and the circuit trouble is again checked and when the circuit trouble is eliminated, the top-layer circuit is created automatically.

In FIG. 1, an input section 1 is a unit for inputting necessary information for automatically generating a top-layer circuit using the apparatus. Input to the input section 1 are input/output information of function circuit and circuit information to which function circuit is connected 12, function circuit test specifications 13, input/output information of top-layer circuit and circuit information to which top-layer circuit is connected 14, test mode generation specifications 15, and terminal test specifications 16.

The input/output information of function circuit and circuit information to which function circuit is connected 12 describes specifications of at least one or more function circuits to implement the function of the semiconductor integrated circuit existing on the layer just below the top layer. For example, if input and output of a function circuit A are aaa and bbb respectively, information such that the input aaa of the function circuit A is connected to output ccc of a function circuit B and the output bbb of the function circuit A is connected to ddd of a function circuit C is described.

The function circuit test specifications 13 describe specifications to control the input/output signal of function circuit in a usual mode and a test mode. For example, if an input signal 1 of an arbitrary function circuit A is assigned to an input signal T1 in a scan test mode, a scan test mode signal and the input signal T1 are added to the function circuit A as input signals and a selector circuit for selecting the input signal 1 and the input signal T1 by the scan test mode signal is added.

Thus, the specifications to control the input/output signal of the function circuit are uniquely defined by the function circuit test specifications 13, so that a test specification addition function circuit to which the input/output signal added to the function circuit in response to the test specifications, the selector circuit for selecting the added input/output signal, and the like are added can be automatically generated based on the HDL description syntax.

The test mode generation specifications 15 define a generation method of a test mode signal for controlling the terminals and internal circuit of semiconductor integrated circuit at least in two states or more for shipment inspection of the semiconductor integrated circuit. (Each terminal is controlled in two or more states if a test mode other than the usual mode exists.)

An example of the test mode generation specifications for creating three test mode signals of a usual mode signal, a scan test mode signal, and a memory test mode signal according to terminals A and B is as follows:
When A=0, B=0, usual mode signal;
when A=0, B=1, scan test mode signal;
when A=1, B=0, memory test mode signal.

Thus, the test mode signal specifications are uniquely defined by the test mode generation specifications 15, so that a test mode generation circuit can be automatically generated based on the HDL description syntax. The same holds true if the number of the test modes increases.

The terminal test specifications 16 define specifications of controlling each terminal to input or output in response to the test specifications and when the terminal is controlled to output, selecting an output signal from function circuit and outputting the signal to the terminal.

An example of the test specifications of a terminal A is as follows:
In usual mode, external output terminal A=internal signal a;
in scan test mode, external output terminal A=internal signal b;
in memory test mode, external output terminal A=internal signal c.

From the specifications, a data selection circuit is configured so as to output the internal signal a in the usual mode, the internal signal b in the scan test mode, and the internal signal c in the memory test mode.

As an example of controlling the input/output information of the function circuit in response to the test specifications, to control memory existing in the function circuit directly from the terminal, a data selection circuit controlled by the test mode signal is inserted into an address signal and a data signal for accessing the memory among the input/output signals of the function circuit for enabling direct access from the terminal.

For example, in the test specifications in which an address input signal a of memory existing in the function circuit A is input from a terminal input signal b in the memory test mode, the terminal input signal b is added to the function circuit A as an input terminal and a data selection circuit for selecting the address input signal a and the terminal input signal b by the memory test mode signal is implemented in the function block circuit A.

Thus, the input/output specifications of the terminal are uniquely defined by the terminal test specifications 16, so that a terminal test circuit can be automatically generated based on the HDL description syntax.

A processing section 2 includes storage means 4, connection information check means 5, top-layer circuit generation means 8, test specification addition function circuit generation means 9, test mode generation circuit generation means 10, and terminal test circuit generation means 11; it determines the presence or absence of a connection defect of the top-layer circuit and automatically generates the top-layer circuit, a test specification addition function circuit, a test mode generation circuit, and a terminal test circuit.

The storage means 4 stores all input data input to the input section 1. The connection information check means 5 includes connection information collation means 6 for collating the signal connection relationship of the top-layer circuit and connection information determination means 7 for determining the presence or absence of a connection defect, and determines the presence or absence of a connection defect of each function circuit.

The connection information check means 5 makes a connection check for each function circuit while referencing all input data stored in the storage means 4. By way of example, if the input signal a of the function circuit A is connected to an output signal m of the function circuit B and the input signal b of the function circuit A is connected to an input signal n of the function circuit C, the input signal a of the function circuit A becomes "NO PROBLEM" and the input signal b becomes "ERROR: INPUT OPEN."

Since the signal connection state is determined for each function circuit, the function circuits B and C are also determined in a similar manner. The output signal m of the function circuit B becomes "NO PROBLEM" and the input signal n of the function circuit C becomes "ERROR: INPUT OPEN."

The top-layer circuit generation means 8 generates the top-layer circuit, the test specification addition function circuit generation means 9 generates a function circuit to which test specifications are added, the test mode generation circuit generation means 10 generates a test mode generation circuit, and the terminal test circuit generation means 11 generates a terminal test circuit.

An output section 3 outputs connection determination result 17 generated by the connection information check means 5 in the processing section 2 and also outputs a top-layer circuit 18, a test specification addition function circuit 19, a test mode generation circuit 20, and a terminal test circuit 21 generated based on the HDL description syntax in the top-layer circuit generation means 8, the test specification addition function circuit generation means 9, the test mode generation circuit generation means 10, and the terminal test circuit generation means 11 of the processing section 2.

First, the connection determination result 17 output to the output section 3 is referenced and if a connection defect is found, the input data input to the input section 1 is corrected and the connection check is repeated until connection defects are eliminated.

If connection defects are eliminated, the top-layer circuit generation means 8, the test specification addition function circuit generation means 9, the test mode generation circuit generation means 10, and the terminal test circuit generation means 11 of the processing section 2 output the top-layer circuit 18, the test specification addition function circuit 19, the test mode generation circuit 20, and the terminal test circuit 21 to the output section 3.

As described above, in the top-layer circuit automatic generation apparatus of the embodiment, all information required for creating the top-layer circuit containing the test specifications is input data, so that integrity of circuit information (input/output information and circuit information to which circuit is connected) in the test mode generation circuit and the terminal test circuit newly created according to the test specifications and the test specification addition function circuit converted according to the test specifications is kept.

Since the input data is corrected according to the connection determination result, a connection mistake can be corrected before the circuit is automatically generated and the top-layer circuit free of a connection error, etc., can be generated in the shortest time.

Second Embodiment

Generally, a circuit described based on the HDL description syntax is designed as function layers (hierarchical organization of functions). Since a function circuit existing just below the top layer of a semiconductor integrated circuit is also designed hierarchically, a high layer of the function circuit can be generated automatically according to a similar technique to that of the apparatus of the first embodiment.

Figure 2:
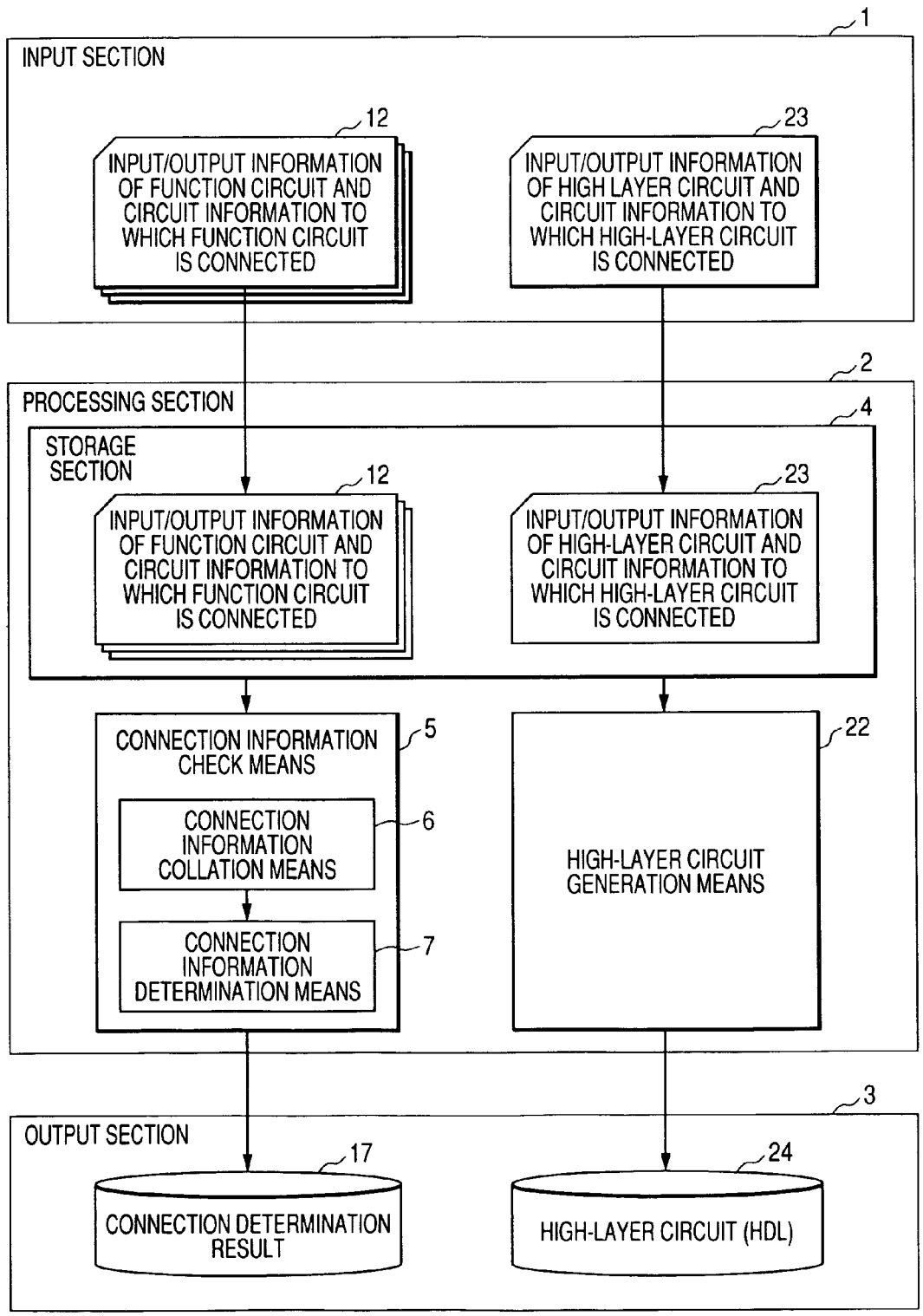
FIG. 2 is a block diagram to show the configuration of a circuit automatic generation apparatus in a second embodiment of the invention.

FIG. 2 is a diagram to show the basic concept of a circuit automatic generation apparatus in a second embodiment of the invention. The circuit automatic generation of the embodiment automatically generates a high-layer circuit of function circuit on any desired layer of a semiconductor integrated circuit.

In FIG. 2, an input section 1 is a unit for inputting necessary information for automatically generating a high-layer circuit using the apparatus. Input to the input section 1 are input/output information of at least one or more function circuits existing on the layer just below a high layer and circuit information to which each of the one or more function circuits are connected 12 and input/output information of the high-layer circuit and circuit information to which the high-layer circuit is connected 23.

A processing section 2 includes storage means 4, connection information check means 5, and high-layer circuit generation means 22, and determines the presence or absence of a connection defect of the high-layer circuit and automatically generates the high-layer circuit.

The storage means 4 stores all input data input to the input section 1. The connection information check means 5 includes connection information collation means 6 for collating the signal connection relationship of the high-layer circuit and connection information determination means 7 for determining the presence or absence of a connection defect, and determines the presence or absence of a connection defect of each function circuit.

The connection information check means 5 makes a connection check for each function circuit while referencing all input data stored in the storage means 4.

An output section 3 outputs connection determination result 17 generated by the connection information check means 5 in the processing section 2 and also outputs a high-layer circuit 24 generated based on the HDL description syntax in the high-layer circuit generation means 22 of the processing section 2.

First, the connection determination result 17 output to the output section 3 is referenced and if a connection defect is found, the input data input to the input section 1 is corrected and the connection check is repeated until connection defects are eliminated. If connection defects are eliminated, the high-layer circuit generation means 22 of the processing section 2 outputs the high-layer circuit 24 to the output section 3.

As described above, in the high-layer circuit automatic generation apparatus of the embodiment, all information required for creating the high-layer circuit is input data, so that integrity of circuit information (input/output information and circuit information to which circuit is connected) with function circuits is kept.

Since the input data is corrected according to the connection determination result, a connection mistake can be corrected before the circuit is automatically generated and the high-layer circuit free of a connection error, etc., can be generated in the shortest time.

Third Embodiment

To insert a data selection circuit in response to test specifications, it is made a rule not to worsen the AC timing (definition of relative delay between clock and input/output data) in a usual mode, and the data selection circuit needs to be configured considering the AC timing desired as specifications.

Figure 3:
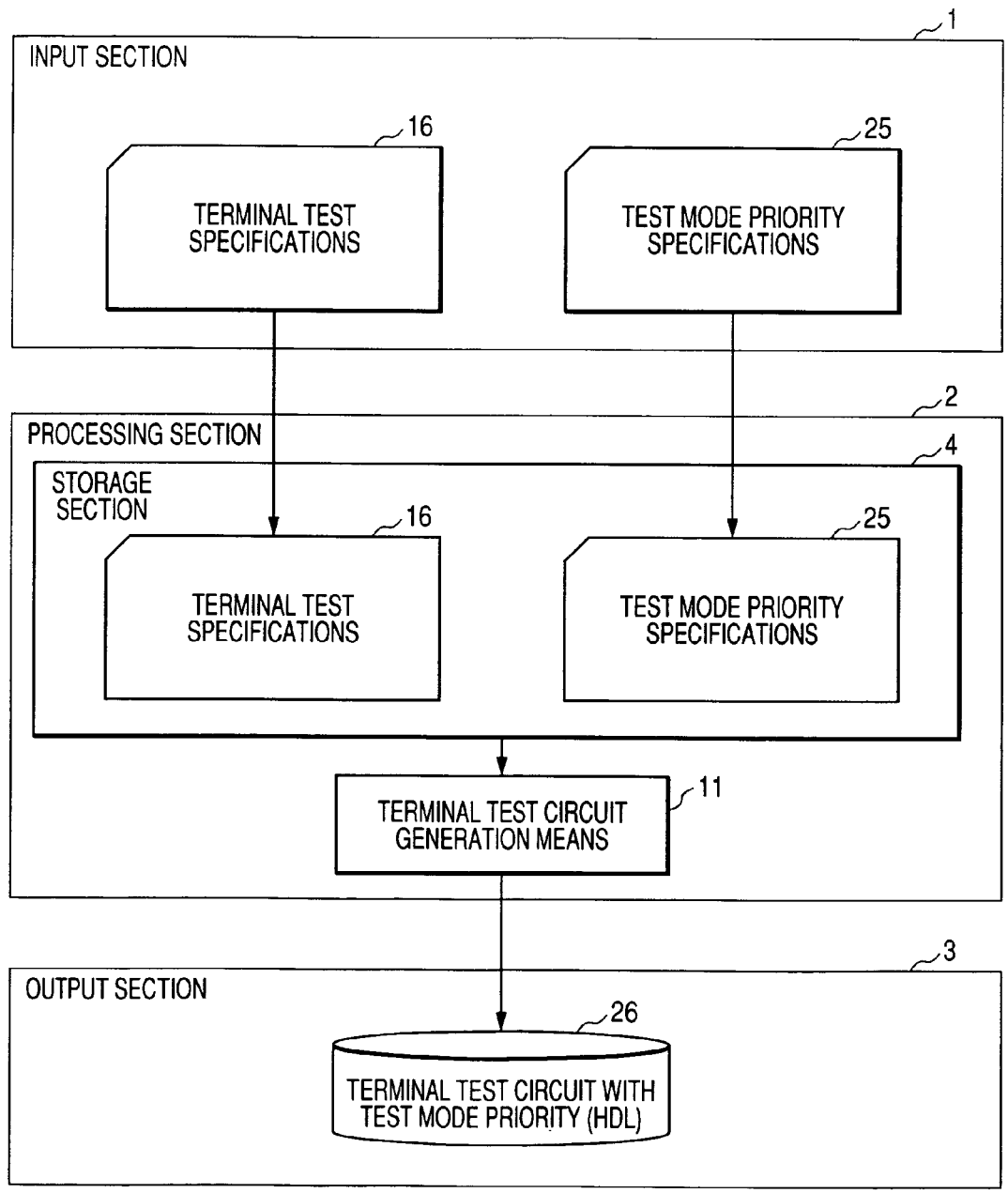
FIG. 3 is a block diagram to show the configuration of a circuit automatic generation apparatus in a third embodiment of the invention.

FIG. 3 is a diagram to show the basic concept of a circuit automatic generation apparatus in a third embodiment of the invention. The circuit automatic generation apparatus of the embodiment configures a data selection circuit so that circuits become higher circuits in the descending order of the test mode priority in inserting the data selection circuit.

In FIG. 3, an input section 1 is a unit for inputting necessary information for automatically generating a top-layer circuit using the apparatus. Input to the input section 1 are terminal test specifications 16 for defining specifications of controlling each terminal to input or output in response to the test specifications and when the terminal is controlled to output, selecting an output signal from function circuit and outputting the signal to the terminal and test mode priority specifications 25.

A processing section 2 includes storage means 4 for storing the terminal test specifications 16 and the test mode priority specifications 25 input to the input section 1 and terminal test circuit generation means 11 for configuring a data selection circuit in response to the test mode priority specifications 25 when the terminal is controlled to output by a test mode signal.

An output section 3 outputs a terminal test circuit with test mode priority 26 generated based on the HDL description syntax by the terminal test circuit generation means 11.

Here, the configuration of the data selection circuit responsive to the test mode priority specifications will be discussed according to a specific example. If three test mode signals of a usual mode signal, a scan test mode signal, and a memory test mode signal are defined, the data selection circuit is configured so as to output an internal signal a in the usual mode, an internal signal b in the scan test mode, and an internal signal c in the memory test mode.

When the data selection circuit is inserted, it is made a rule not to worsen the AC timing (definition of relative delay between clock and input/output data) in the usual mode; particularly in the test specifications for selecting three or more signals, the data selection circuit needs to be configured considering the AC timing desired as the specifications.

The data selection circuit is put into a tree structure so as to provide one data selection circuit added according the test specifications at the worst in the usual mode, namely, so as to set a data selection circuit for selecting usual time data and test time data.

As the data selection circuit is put into a tree structure, if test modes are assigned priority, automatically the data selection circuit is put into a tree responsive to the priority. The signal selected in the test mode assigned high priority is positioned at the later stage of the data selection circuit tree, so that the number of circuit stages becomes small and a high-speed circuit can be provided. In contrast, the signal selected in the test mode assigned low priority is positioned at the preceding stage of the data selection circuit tree, so that the number of circuit stages becomes large and the low-speed configuration results.

Thus, the specifications of the data selection circuit tree are uniquely defined according to the terminal test specifications uniquely defining the test mode priority, so that the terminal test circuit with priority assigned to the data selection circuit can be generated automatically based on the HDL description syntax.

Fourth Embodiment

If the AC timing of a terminal test circuit is severe, it is desirable that the terminal test circuit should be placed in the proximity of the relevant terminal considering not only the circuit configuration, but also the physical placement.

Accordingly, the AC timing is eased, worsening the AC timing because of a wiring detour is prevented, and an increase in the area of a semiconductor integrated circuit caused by routing of wiring can also be prevented.

On the other hand, the number of a semiconductor integrated circuit has increased with the larger scale and the higher function of a recent a semiconductor integrated device, and a semiconductor integrated circuit having more than 300 terminals is not rare. If terminal test circuits are created in a one-to-one correspondence with terminals, the number of function terminals increases and the number of design steps is increased.

Then, it is necessary to create a terminal test circuit flexibly according to a tradeoff between the physical placement considering the AC timing and the number of design steps. For example, a terminal test circuit is created as it is divided into four circuits of top, bottom, right, and left sides, so that the physical placement considering the AC timing and the number of design steps can be harmonized.

Figure 4:
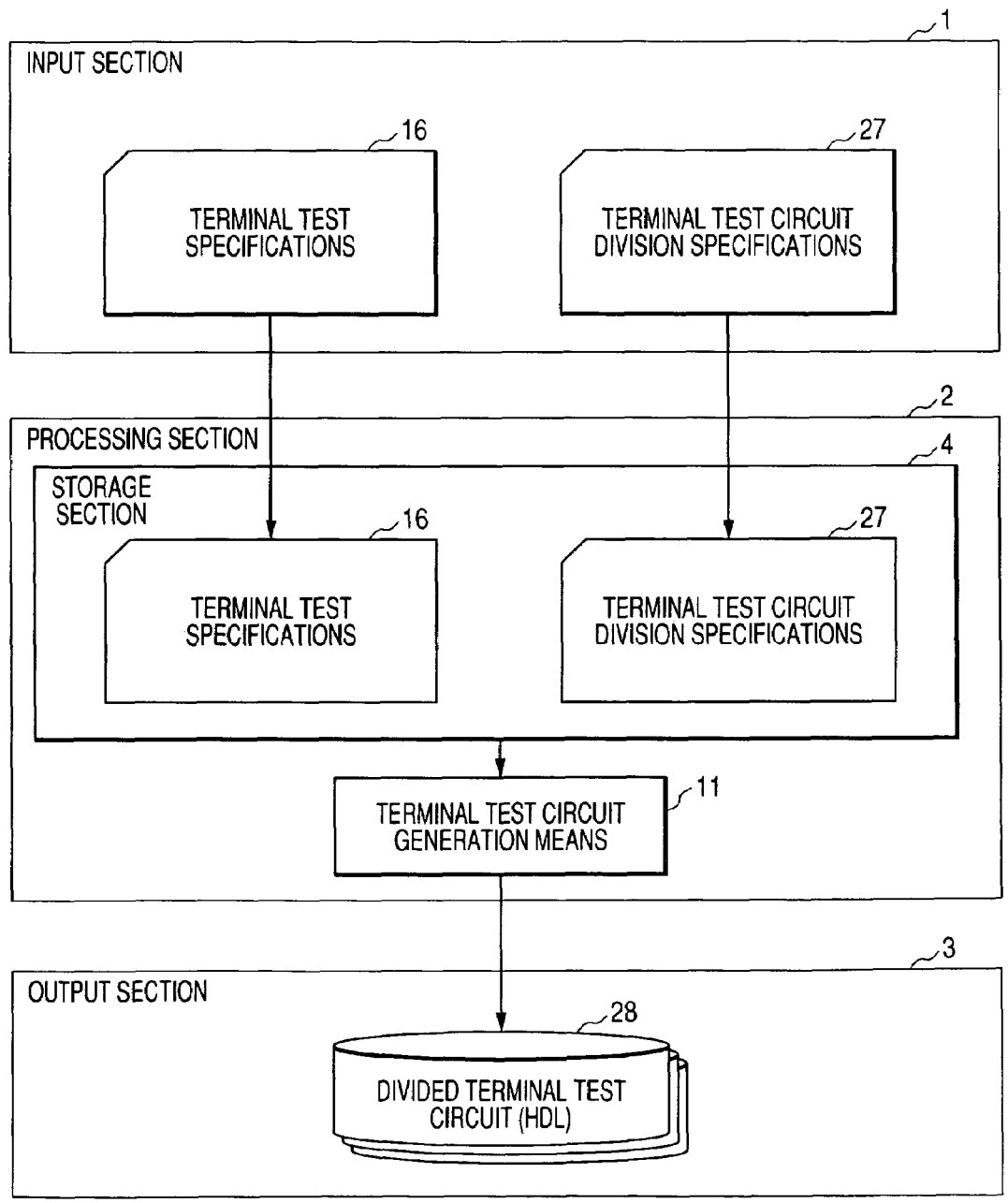
FIG. 4 is a block diagram to show the configuration of a circuit automatic generation apparatus in a fourth embodiment of the invention.

FIG. 4 is a diagram to show the basic concept of a circuit automatic generation apparatus in a fourth embodiment of the invention. The circuit automatic generation apparatus of the embodiment divides a terminal test circuit according to terminal test circuit dividing specifications when a data selection circuit is inserted and automatically generates a circuit considering the physical placement.

In FIG. 4, an input section 1 is a unit for inputting necessary information for automatically generating a top-layer circuit using the apparatus. Input to the input section 1 are terminal test specifications 16 for automatically generating a terminal test circuit for controlling each terminal to input or output in response to the test specifications and when the terminal is controlled to output, selecting an output signal from function circuit and outputting the signal to the terminal and terminal test circuit division specifications 27 for specifying the division specifications of the terminal test circuit.

A processing section 2 includes storage means 4 for storing the terminal test specifications 16 and the terminal test circuit division specifications 27 input to the input section 1 and terminal test circuit generation means 11 for generating divided terminal test circuits from the terminal test specifications 16 and the terminal test circuit division specifications 27.

An output section 3 outputs a divided terminal test circuit 28 generated based on the HDL description syntax by the terminal test circuit generation means 11.

Thus, if the AC timing of the terminal test circuit is severe, the terminal test circuit is divided as desired, so that the flexibility of the physical placement can be enhanced and each divided terminal test circuit 28 is placed in the proximity of the relevant terminal, so that the AC timing can be eased.

Fifth Embodiment

Figure 5:
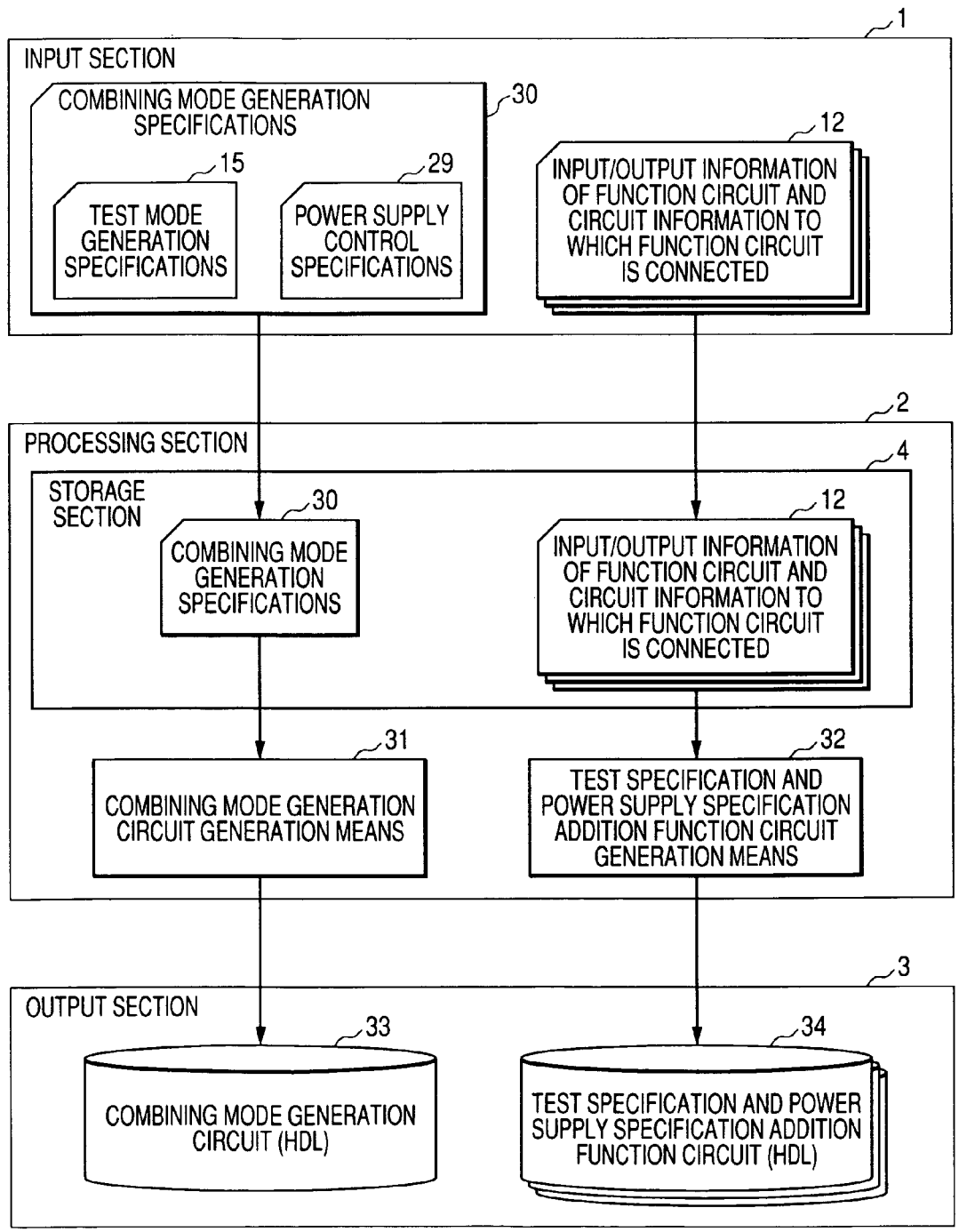
FIG. 5 is a block diagram to show the configuration of a circuit automatic generation apparatus in a fifth embodiment of the invention.

FIG. 5 is a diagram to show the basic concept of a circuit automatic generation apparatus in a fifth embodiment of the invention. The circuit automatic generation apparatus of the embodiment automatically generates a combining mode generation circuit and a test specification and power supply specification addition function circuit in response to combining mode generation specifications having test mode generation specifications and power supply control specifications.

In FIG. 5, an input section 1 is a unit for inputting necessary information for automatically generating a combining mode generation circuit 33 and a test specification and power supply specification addition function circuit 34 using the apparatus. Input to the input section 1 are combining mode generation specifications 30 made up of test mode generation specifications 15 and power supply control specifications 29 for automatically generating the combining mode generation circuit 33, and input/output information of function circuit and circuit information to which function circuit is connected 12.

A processing section 2 includes storage means 4 for storing the combining mode generation specifications 30 and the input/output information of function circuit and circuit information to which function circuit is connected 12 input to the input section 1, combining mode generation circuit generation means 31, and test specification and power supply specification addition function circuit generation means 32.

An output section 3 outputs a combining mode generation circuit 33 and a test specification and power supply specification addition function circuit 34 automatically generated based on the HDL description syntax by the combining mode generation circuit generation means 31 and the test specification and power supply specification addition function circuit generation means 32.

The power supply control specifications 29 define a method of dividing the power supply of a semiconductor integrated circuit into two or more power supply channels and controlling semiconductor elements for each provided power supply channel for low power consumption of the semiconductor integrated circuit. When the semiconductor integrated circuit is inspected, test circuit design also needs to be examined so that a large current exceeding the capability of the test machine for inspection or the value at the usual use time does not flow.

Generally, a central processing unit (CPU) performs power supply control. In the low power consumption mode, the CPU issues a power shutdown instruction for stopping power supply of the power supply channel to which the power shutdown instruction is applied.

The semiconductor integrated circuit is provided with a plurality of power supply control registers in response to a plurality of power supply channels and a power shutdown flag of the power supply to be shut down is set in the power supply control register. The register value can be referenced for shutting down any desired power supply channel of the semiconductor integrated circuit.

If the register value is referenced and the power is shut down, the output signal of the semiconductor integrated circuit element belonging to the shut-down power supply channel becomes unstable and if the semiconductor integrated circuit element to which the power is supplied receives the output signal as an input signal, the gate input becomes unstable and a leakage current continues to flow at all times. To circumvent the leakage current when the power is shut down, the gate input of the semiconductor integrated circuit element to which the power is supplied needs to be fixed by a power supply control circuit.

If the power supply control register value only is referenced and the gate input of the semiconductor integrated circuit element to which the power is supplied is controlled, there is a possibility that it may be made impossible to control the semiconductor integrated circuit element from a test mode signal and therefore the circuit design of the power supply control mechanism needs to be examined together with the test mode mechanism.

An example of generating test mode signals according to terminals A and B is as follows:
When terminal A=0, terminal B=0, usual mode signal;
when terminal A=0, terminal B=1, scan test mode signal;
when terminal A=1, terminal B=0, memory test mode signal.

An example of adding power supply control specifications for controlling two channels of power A and B according to registers A and B is as follows:
When terminal A=0, terminal B=0, register A=0, register B=0, usual mode signal for supplying power A and power B;
when terminal A=0, terminal B=0, register A=1, register B=0, usual mode signal for shutting down power A and supplying power B;
when terminal A=0, terminal B=0, register A=0, register B=1, usual mode signal for supplying power A and shutting down power B;
when terminal A=0, terminal B=1, register A=0, register B=0, scan test mode signal for supplying power A and power B;
when terminal A=0, terminal B=1, register A=1, register B=0, scan test mode signal for shutting down power A and supplying power B;
when terminal A=0, terminal B=1, register A=0, register B=1, scan test mode signal for supplying power A and shutting down power B;
when terminal A=1, terminal B=0, register A=0, register B=0, memory test mode signal for supplying power A and power B;
when terminal A=1, terminal B=0, register A=1, register B=0, memory test mode signal for shutting down power A and supplying power B;
when terminal A=1, terminal B=0, register A=0, register B=1, memory test mode signal for supplying power A and shutting down power B.

Thus, the combining mode generation circuit considering the power supply control specifications becomes substantially complicated as compared with the test mode generation circuit involving the test mode signals only.

On the other hand, in the step of generating a top-layer circuit, the connection relationship of the top-layer circuit becomes further complicated because of the combining mode generation specifications; it is necessary to generate the top-layer circuit connected rightly to the function circuit and the function circuit to which the combining mode generation specifications are added.

However, to create the power supply control mechanism and the test mode mechanism rapidly and with no mistake, it is necessary to radically remedy "manual work of a plurality of designers as work in each step" of the design method problem in the related art.

According to the described configuration, the combining mode generation circuit, the test specifications, and the power supply control specification addition function circuit can be generated automatically, the integrity of the top-layer circuit information is kept, and a large number of design steps are unified, so that the problems in the related arts such as "manual work of a plurality of designers as work in each step" are solved and as the circuit specifications are simply input, the connection information is checked and then the top-layer circuit is generated. Thus, long-hour work and waste of a great deal of time as manual return is repeated in the design steps in the related arts can be circumvented and a high-quality product can be designed efficiently.

Sixth Embodiment

To check the connection determination result for each function circuit, if the connection determination result for each function circuit is checked one at a time, feedback of connection defect correction is delayed.

It is desirable that the connection defect correction should be able to be fed back using a summary describing the number of defect items occurring for each function circuit aside from the connection defect determination result for each circuit.

Figure 6:
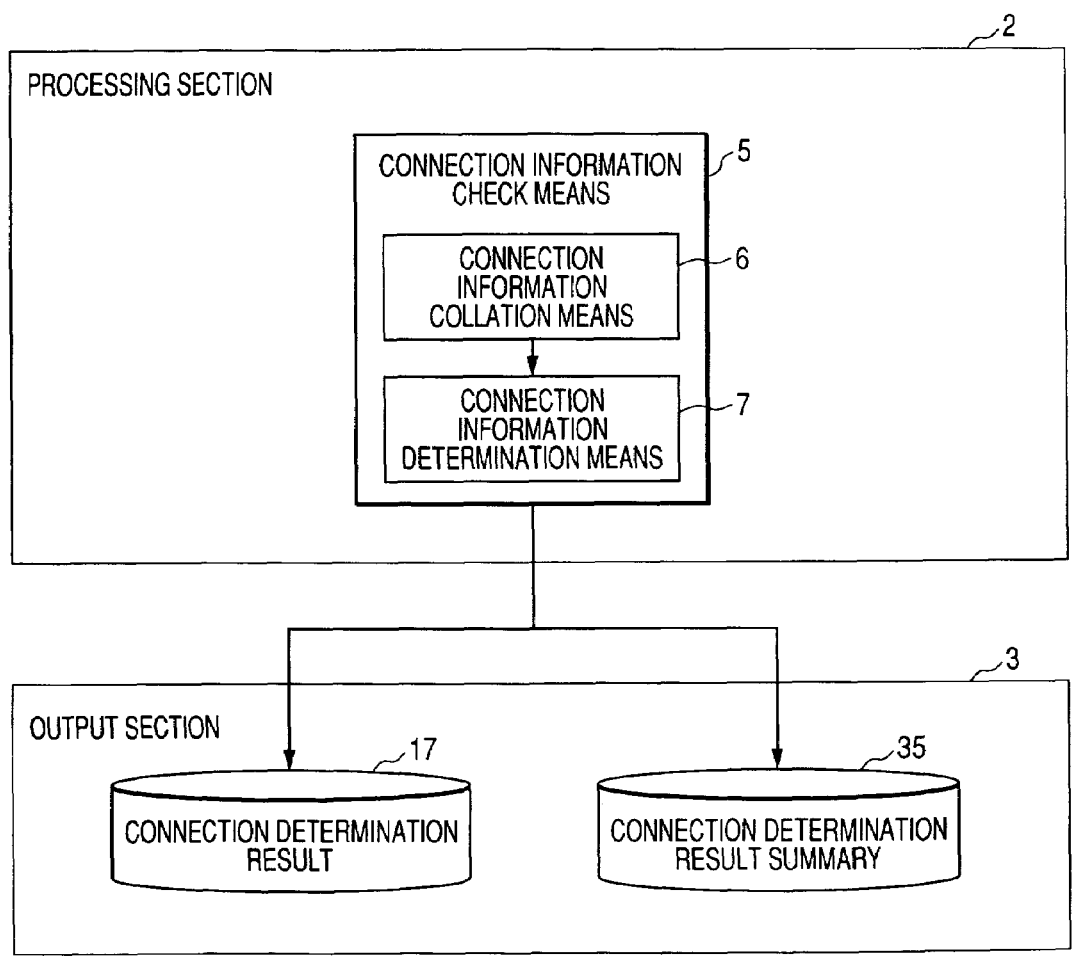
FIG. 6 is a block diagram to show the configuration of a circuit automatic generation apparatus in a sixth embodiment of the invention.

FIG. 6 is a diagram to show the basic concept of a circuit automatic generation apparatus in a sixth embodiment of the invention. In FIG. 6, a processing section 2 includes connection information check means 5 having connection information collation means 6 and connection information determination means 7, and determines the presence or absence of a connection defect of a top-layer function circuit.

An output section 3 outputs connection determination result 17 and a connection determination result summary 35 generated by the connection information check means 5 in the processing section 2.

According to the described configuration, observation of the determination result is improved and the correction can be fed back rapidly.

Seventh Embodiment

It is also possible that the input data required for generating a top-layer circuit, namely, input/output information of function circuit and circuit information to which function circuit is connected, test mode generation specifications, function circuit test specifications added to function circuit, terminal test specifications, etc., cannot be updated because of the design policy, etc. Even in such a case, it is desirable that the data should be able to be updated in response to correction specifications.

Figure 7:
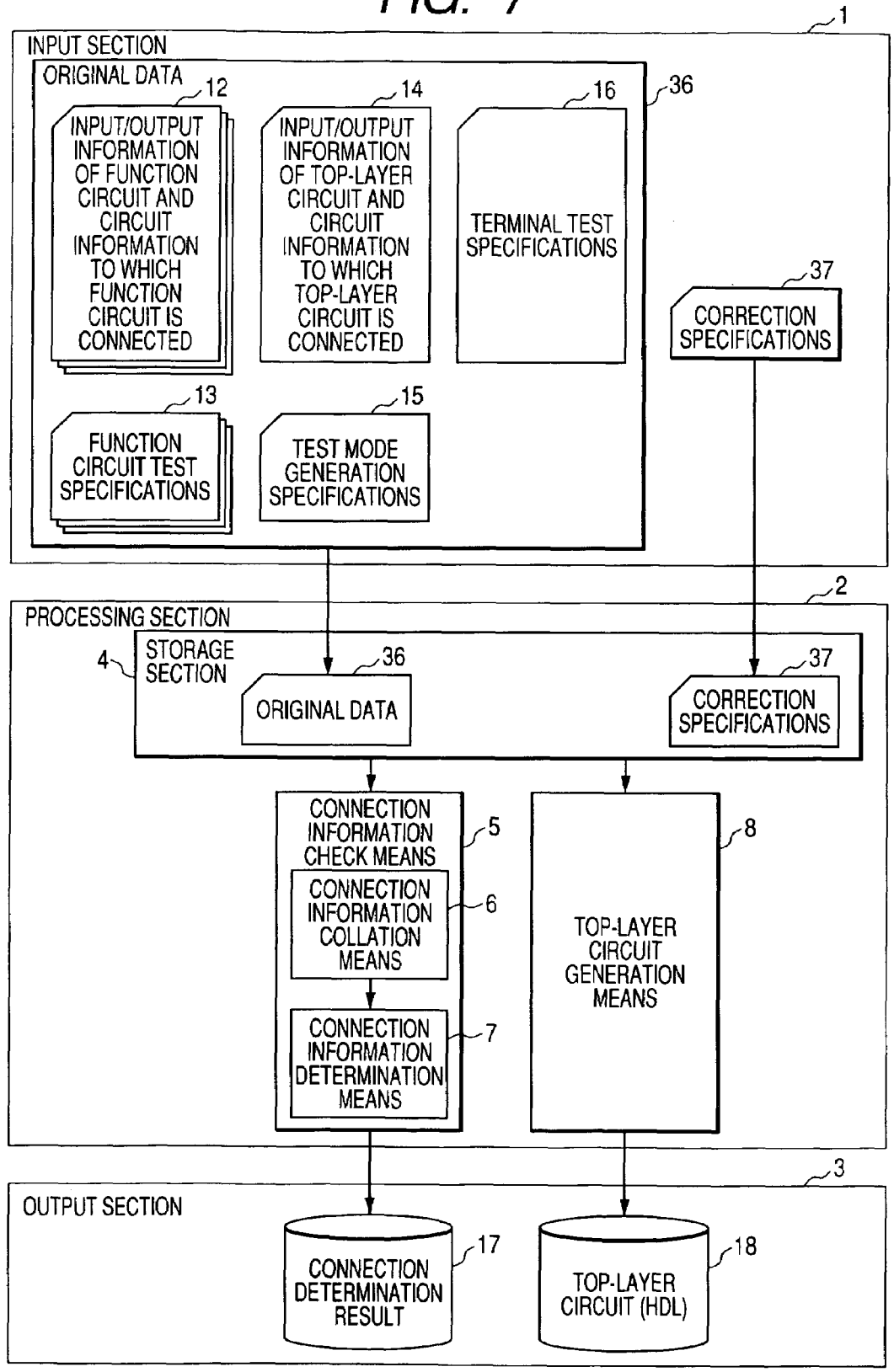
FIG. 7 is a block diagram to show the configuration of a circuit automatic generation apparatus in a seventh embodiment of the invention.

FIG. 7 is a diagram to show the basic concept of a circuit automatic generation apparatus in a seventh embodiment of the invention. The circuit automatic generation apparatus of the embodiment automatically generates a top-layer circuit in response to the correction specifications.

In FIG. 7, an input section 1 is a unit for inputting necessary information for automatically generating a top-layer circuit using the apparatus. Input to the input section 1 are input/output information of function circuit and circuit information to which function circuit is connected 12, function circuit test specifications 13, input/output information of top-layer circuit and circuit information to which top-layer circuit is connected 14, test mode generation specifications 15, terminal test specifications 16, and correction specifications 37.

A processing section 2 includes storage means 4, connection information check means 5, and top-layer circuit generation means 8; it determines the presence or absence of a connection defect of the top-layer circuit and automatically generates connection determination result 17 and top-layer circuit 18.

The storage means 4 stores the input/output information of function circuit and circuit information to which function circuit is connected 12, the function circuit test specifications 13, the input/output information of top-layer circuit and circuit information to which top-layer circuit is connected 14, the test mode generation specifications 15, and the terminal test specifications 16 as original data 36, and also stores the correction specifications 37.

The connection information check means 5 generates the connection determination result 17 while referencing the original data 36 and the correction specifications 37 stored in the storage means 4.

The top-layer circuit generation means 8 generates the top-layer circuit 18.

An output section 3 outputs the connection determination result 17 generated by the connection information check means 5 in the processing section 2 and also outputs the top-layer circuit 18 generated based on the HDL description syntax in the top-layer circuit generation means 8.

According to the described configuration, even if the original data 36 cannot be corrected, the correction specifications 37 are additionally input, whereby the corrected top-layer circuit can be generated automatically.

Eighth Embodiment

Figure 8:
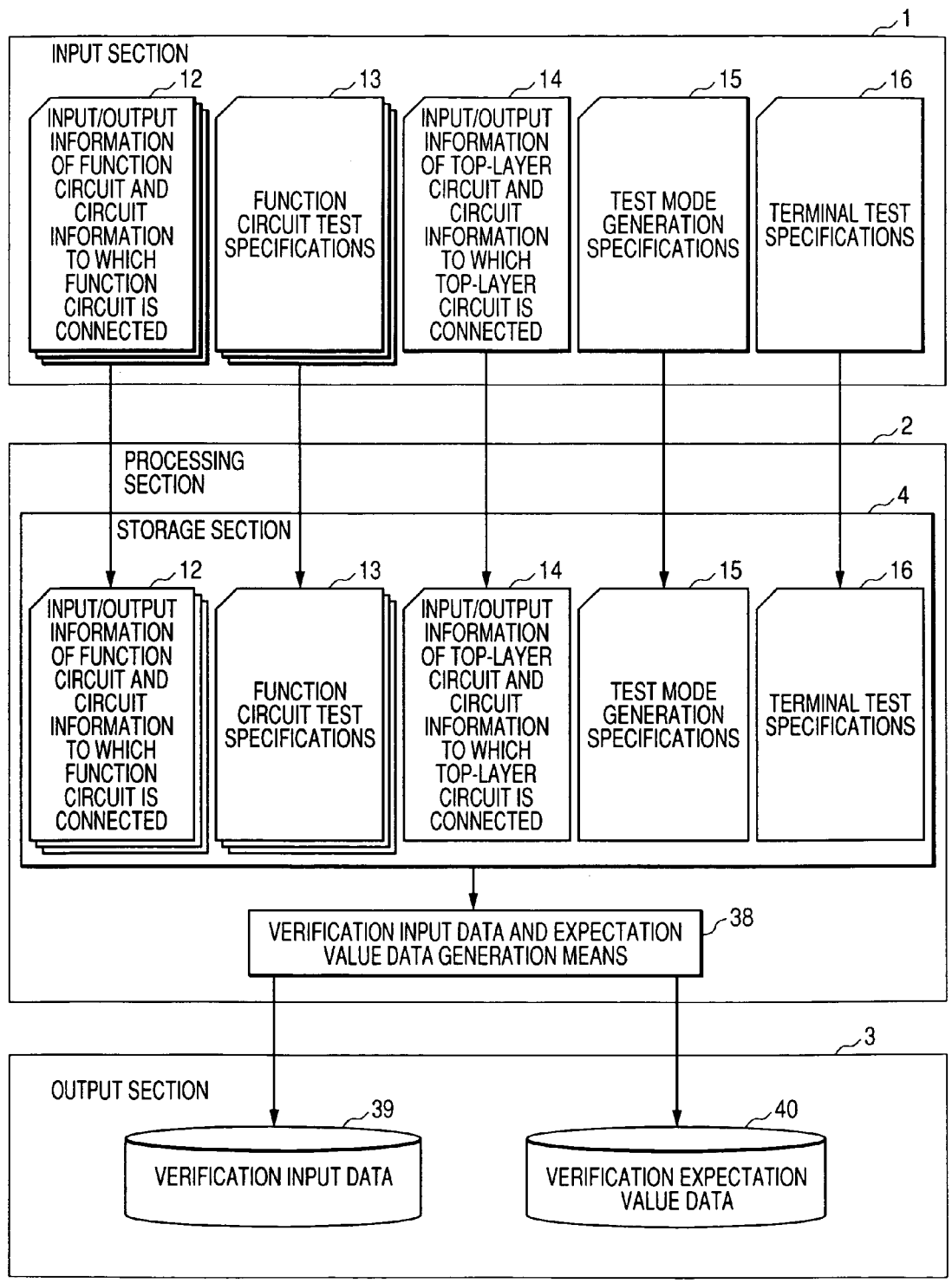
FIG. 8 is a block diagram to show the configuration of a circuit automatic generation apparatus in an eighth embodiment of the invention.

FIG. 8 is a diagram to show the basic concept of a circuit automatic generation apparatus in an eighth embodiment of the invention. The circuit automatic generation apparatus of the embodiment automatically generates input data and expectation value data to verify a semiconductor integrated circuit in response to operation mode specifications and circuit information.

In FIG. 8, an input section 1 is a unit for inputting necessary information for automatically generating input data and expectation value data to verify a semiconductor integrated circuit using the apparatus. Input to the input section 1 are input/output information of function circuit and circuit information to which function circuit is connected 12, function circuit test specifications 13, input/output information of top-layer circuit and circuit information to which top-layer circuit is connected 14, test mode generation specifications 15, and terminal test specifications 16.

A processing section 2 includes storage means 4 and verification input data and expectation value data generation means 38, and automatically generates verification input data 39 and verification expectation value data 40.

The storage means 4 stores the input/output information of function circuit and circuit information to which function circuit is connected 12, the function circuit test specifications 13, the input/output information of top-layer circuit and circuit information to which top-layer circuit is connected 14, the test mode generation specifications 15, and the terminal test specifications 16. Whether each terminal is input or output is determined by the test mode generation specifications 15 and the terminal test specifications 16. Circuits to which the top-layer circuit and each function circuit are connected are determined by the input/output information of function circuit and circuit information to which function circuit is connected 12, the function circuit test specifications 13, and the input/output information of top-layer circuit and circuit information to which top-layer circuit is connected 14.

The verification input data and expectation value data generation means 38 automatically generates the verification input data 39 and the verification expectation value data 40 responsive to the verification purpose while referencing all input data stored in the storage means 4.

Figure 9:
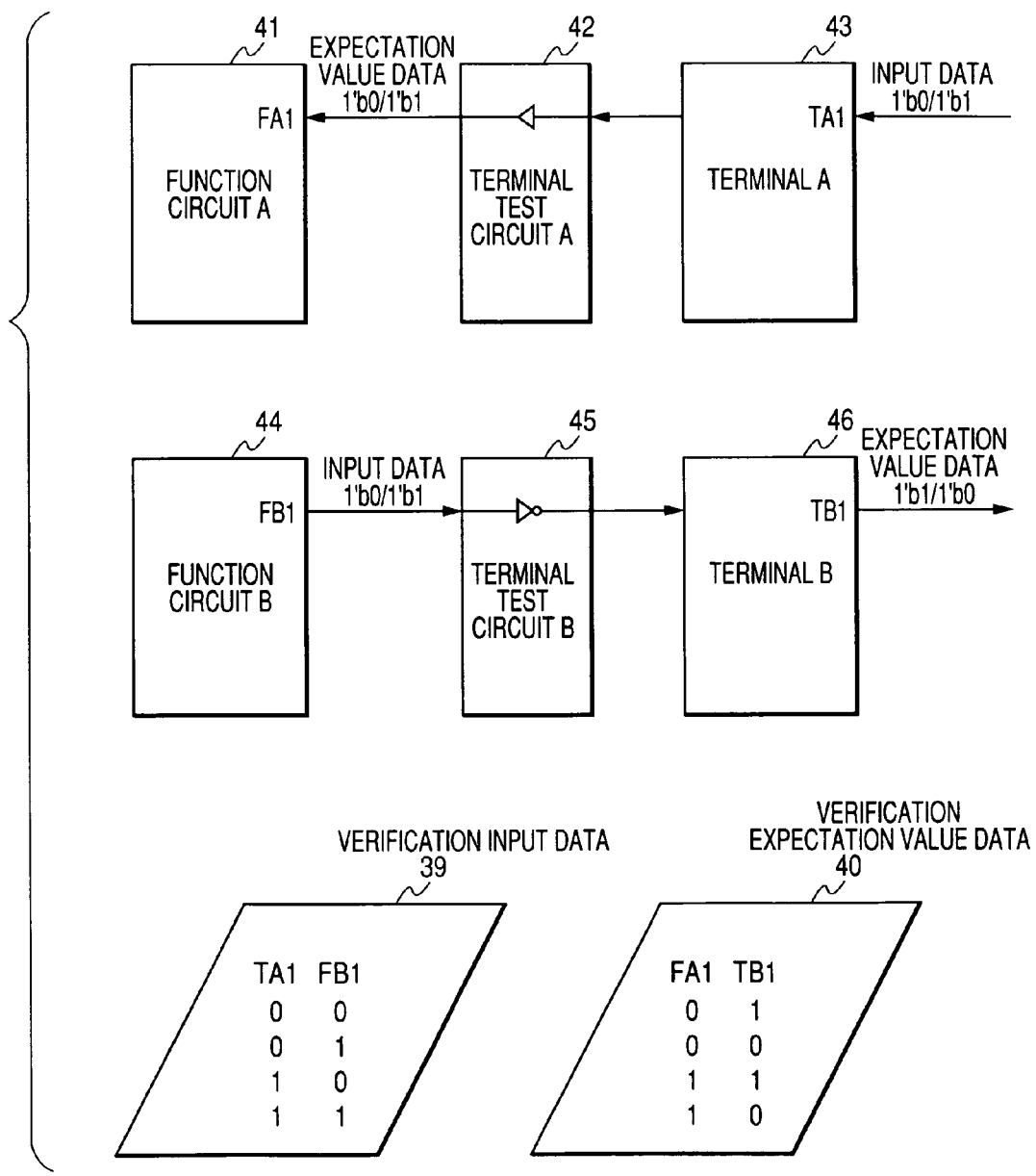
FIG. 9 is a drawing to show how verification input data and verification expectation value data are automatically generated in the circuit automatic generation apparatus in the eighth embodiment of the invention.

FIG. 9 is a drawing to show a specific mode of automatically generating the verification input data and the verification expectation value data to verify the terminals of a semiconductor integrated circuit in the embodiment.

In FIG. 9, the input/output directions of terminals A and B and circuit terminals to which terminals A and B are connected are determined and logics of terminal test circuits A and B are determined while all input data input to the input section 1 in FIG. 8 is referenced in response to the operation mode to which function verification is applied. That is, the terminal A is connected to input FA1 of a function circuit A as an input terminal and the terminal B is connected from output FB1 of a function circuit B as an output terminal according to the operation mode. Logic is held in the terminal test circuit A and is inverted in the terminal test circuit B.

If 1′b0 or 1′b1 is input to input TA1 of input terminal A 43 as verification input data, the logic of terminal test circuit A 42 determined by the operation mode is referenced and 1′b0 or 1′b1 is generated as expectation value data in input FA1 of function circuit A 41 to which the circuit is connected.

On the other hand, if 1′b0 or 1′b1 is input to output FB1 of function circuit B 44 as verification input data, 1′b1 or 1′b0 is generated as expectation value data in output TB1 of output terminal B 46 because the logic of terminal test circuit B 45 is inverted. The necessary points are extracted in response to the function verification item, whereby the verification input data and the verification expectation value data can be generated.

Thus, the verification input data and the verification expectation value data of all terminals can be easily generated automatically in response to all operation modes. The verification input data and the verification expectation value data are input to a dynamic verification tool and circuit verification is conducted, so that the quality of a semiconductor integrated circuit can be improved.

Ninth Embodiment

Figure 10:
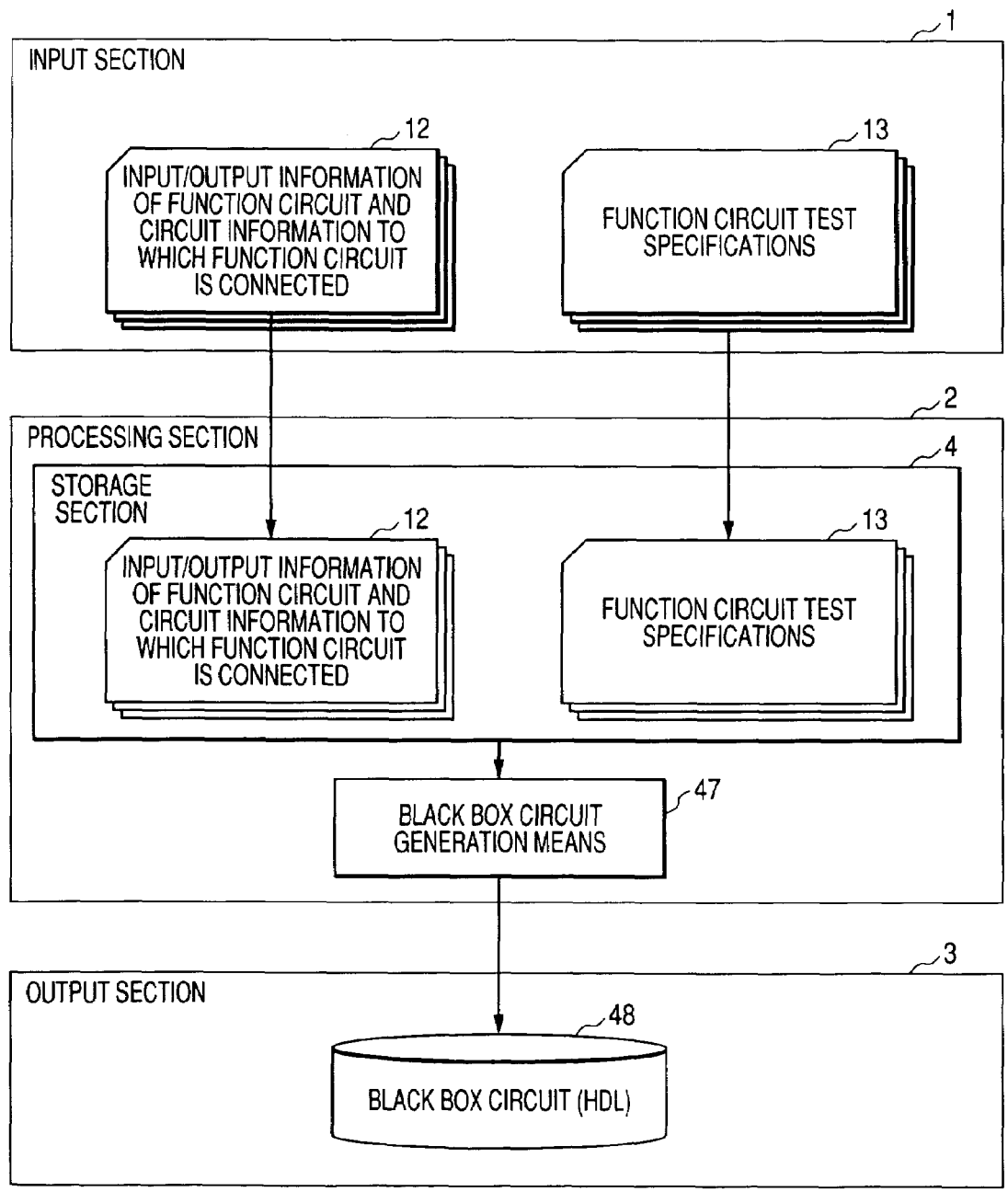
FIG. 10 is a block diagram to show the configuration of a circuit automatic generation apparatus in a ninth embodiment of the invention.

FIG. 10 is a diagram to show the basic concept of a circuit automatic generation apparatus in a ninth embodiment of the invention. The circuit automatic generation apparatus of the embodiment automatically generates a black box circuit to which function verification is not applied when a semiconductor integrated circuit is verified, based on the HDL description syntax.

In FIG. 10, input/output information of function circuit and circuit information to which function circuit is connected 12 and function circuit test specifications 13 are input to an input section 1.

A processing section 2 includes storage means 4 and black box circuit generation means 47 and automatically generates a black box circuit 48 described based on the HDL description syntax.

The storage means 4 stores the input/output information of function circuit and circuit information to which function circuit is connected 12 and the function circuit test specifications 13.

The black box circuit generation means 47 automatically generates the black box circuit 48 with only input/output described, based on the HDL description syntax in response to the input/output information of function circuit and circuit information to which function circuit is connected 12 and the function circuit test specifications 13.

Thus, the black box circuit 48 to which function verification is not applied can be easily generated automatically in response to the function verification item, so that the function verification time can be shortened.

Tenth Embodiment

Figure 11:
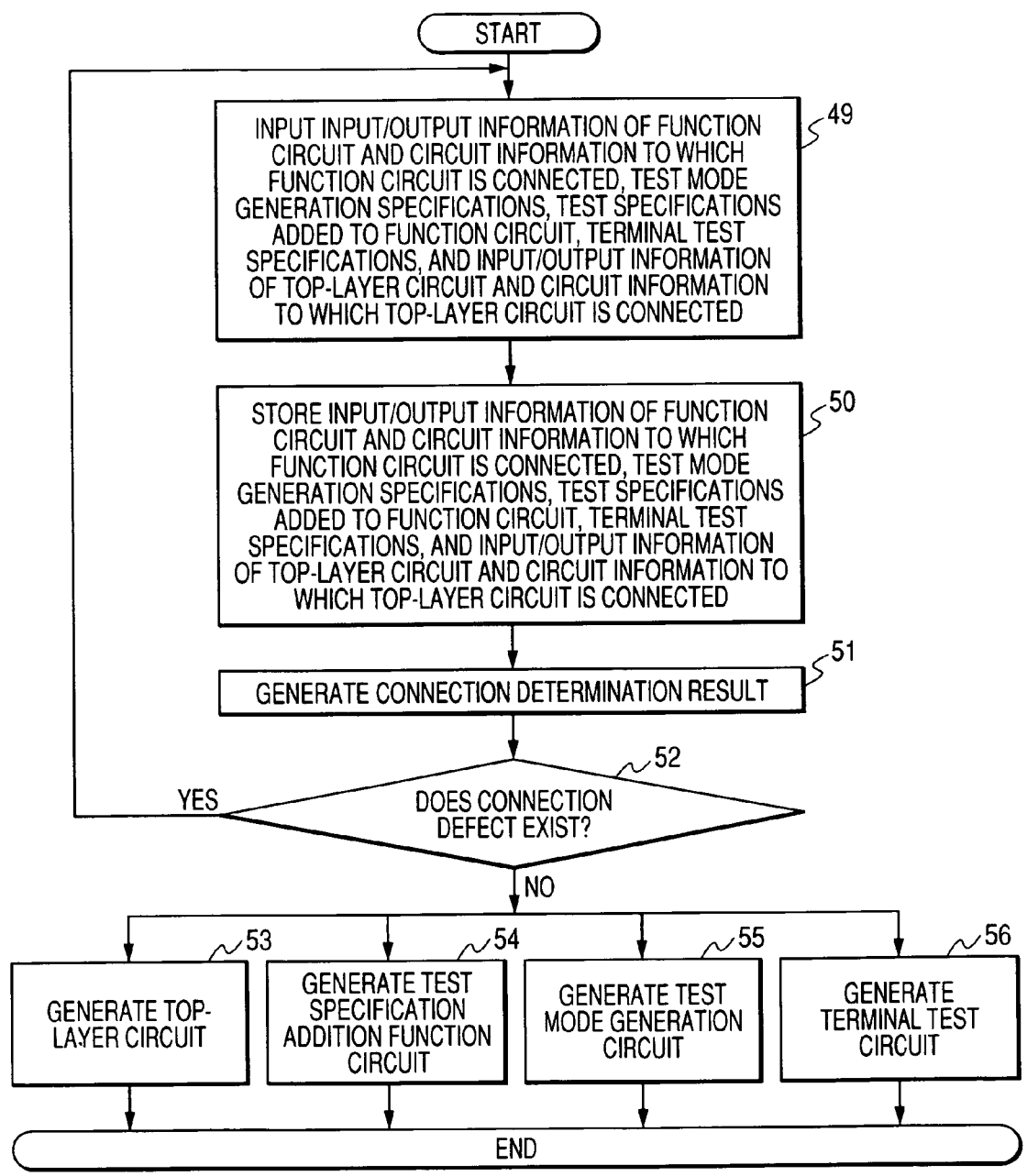
FIG. 11 is a flowchart to show the processing process of a circuit automatic generation method in a tenth embodiment of the invention.

FIG. 11 is a flowchart to show the basic concept of a circuit automatic generation method in a tenth embodiment of the invention. The circuit automatic generation method of the embodiment is a method of automatically generating a top-layer circuit based on the HDL description syntax by inputting generation specifications of a test mode signal for controlling a semiconductor integrated circuit, terminal test specifications for controlling terminals by a test mode signal, input/output information of function circuit and circuit information to which function circuit is connected, test specifications added to each function circuit, and input/output information of the top-layer circuit and circuit information to which the top-layer circuit is connected to an input section.

In FIG. 11, input at an input step 49 are test mode generation specifications for generating a test mode signal for controlling the terminals and internal circuit of semiconductor integrated circuit at least in two states or more, terminal test specifications for automatically generating a terminal test circuit for controlling each terminal to input or output in response to the test specifications and when the terminal is controlled to output, selecting an output signal from function circuit and outputting the signal to the terminal, input/output information of one or more function circuits existing on the layer just below the top layer and circuit information to which each of the one or more function circuits are connected, function circuit test specifications for controlling the input/output information signal of function circuit at the test time, and input/output information of top-layer circuit and circuit information to which top-layer circuit is connected.

At a storage step 50, all input data input at the input step 49 is stored. At a connection information determination result generation step 51, the stored data is referenced, the signal connection relationship of the top-layer circuit is collated, the presence or absence of a connection defect of the top-layer circuit is determined, and the connection determination result is output. If the output connection determination result indicates a defect, an input information connection error, etc., is eliminated by correction based on the connection determination result.

After the correction, again the connection information determination result is generated at the connection information determination result generation step 51. As soon as the connection information determination result does not involve any problem, at a top-layer circuit generation step 53 of generating a top-layer circuit, a test specification addition function circuit generation step 54 of generating a function circuit to which test specification are added, a test mode generation circuit generation step 55 of generating a test mode generation circuit, and a terminal test circuit generation step 56 of generating a terminal test circuit, a top-layer circuit, a test specification addition function circuit, a test mode generation circuit, and a terminal test circuit are automatically generated and are output.

In the top-layer circuit automatic generation method of the embodiment, all information required for creating the top-layer circuit containing the test specifications is input data, so that integrity of circuit information (input/output information and circuit information to which circuit is connected) in the test mode generation circuit and the terminal test circuit newly created according to the test specifications and the test specification addition function circuit converted according to the test specifications is kept.

Since the input data is corrected according to the connection determination result, a connection mistake can be corrected before the circuit is automatically generated and the top-layer circuit free of a connection error, etc., can be generated in the shortest time.

Eleventh Embodiment

Figure 12:
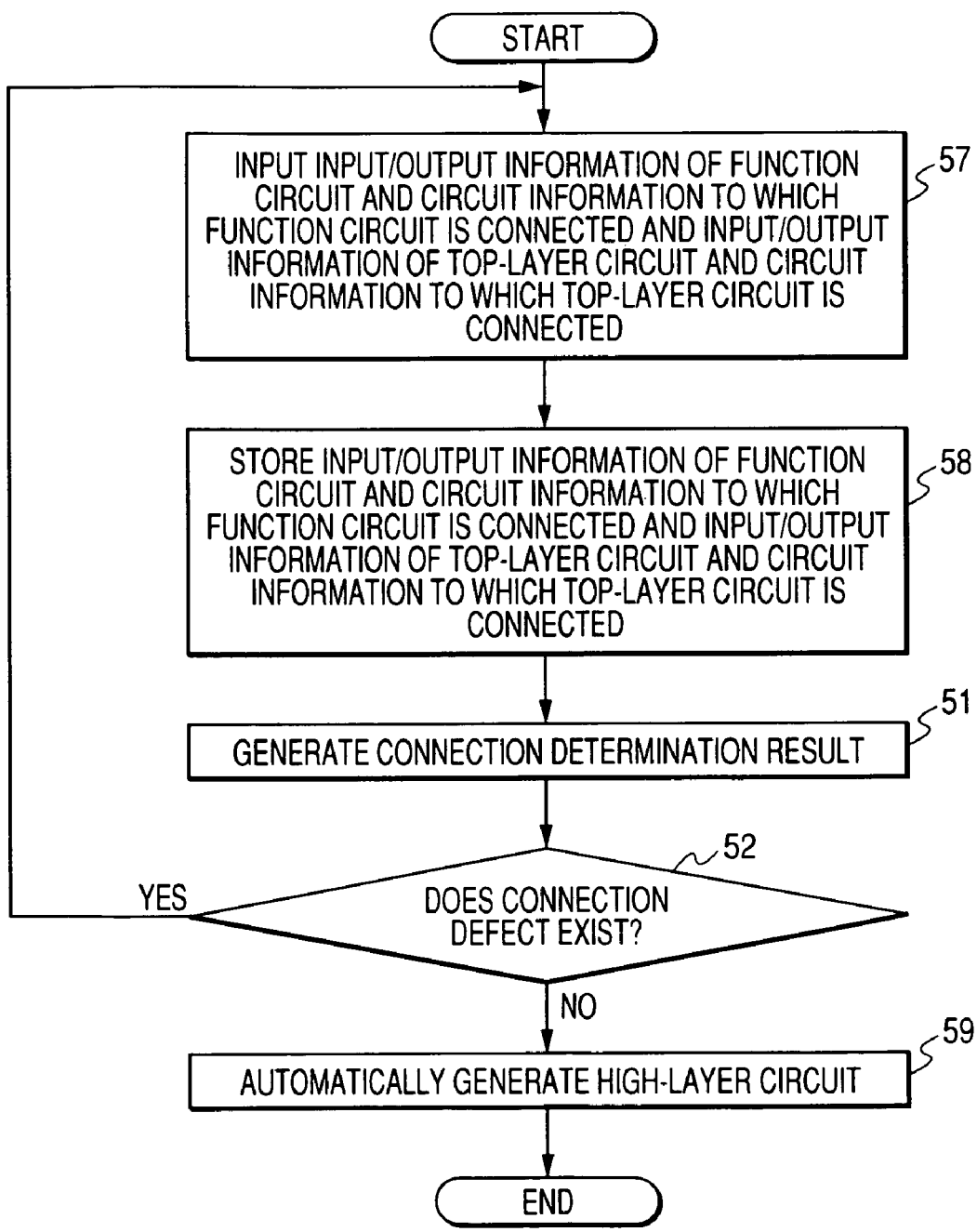
FIG. 12 is a flowchart to show the processing process of a circuit automatic generation method in an eleventh embodiment of the invention.

FIG. 12 is a flowchart to show the basic concept of a circuit automatic generation method in an eleventh embodiment of the invention. The circuit automatic generation method of the embodiment is a method of automatically generating a high-layer circuit of function circuit on any desired layer of a semiconductor integrated circuit.

In FIG. 12, input at an input process 57 are necessary information for automatically generating a high-layer circuit, namely, input/output information of at least one or more function circuits existing on the layer just below a high layer and circuit information to which each of the one or more function circuits are connected and input/output information of the high-layer circuit and circuit information to which the high-layer circuit is connected.

At a storage step 58, all input data input at the input step 57 is stored. At a connection information determination result generation step 51, the stored data is referenced, the signal connection relationship of a high-layer circuit is collated, the presence or absence of a connection defect of the high-layer circuit is determined, and the connection determination result is output. If the output connection determination result indicates a defect, an input information connection error, etc., is eliminated by correction based on the connection determination result.

After the correction, again the connection information determination result is generated at the connection information determination result generation step 51. As soon as the connection information determination result does not involve any problem, high-layer circuit is automatically generated and is output at a high-layer circuit generation step 59.

In the high-layer circuit automatic generation method of the embodiment, all information required for creating the high-layer circuit is input data, so that integrity of circuit information (input/output information and circuit information to which circuit is connected) with function circuits is kept.

Since the input data is corrected according to the connection determination result, a connection mistake can be corrected before the circuit is automatically generated and the high-layer circuit free of a connection error, etc., can be generated in the shortest time.

Twelfth Embodiment

Figure 13:
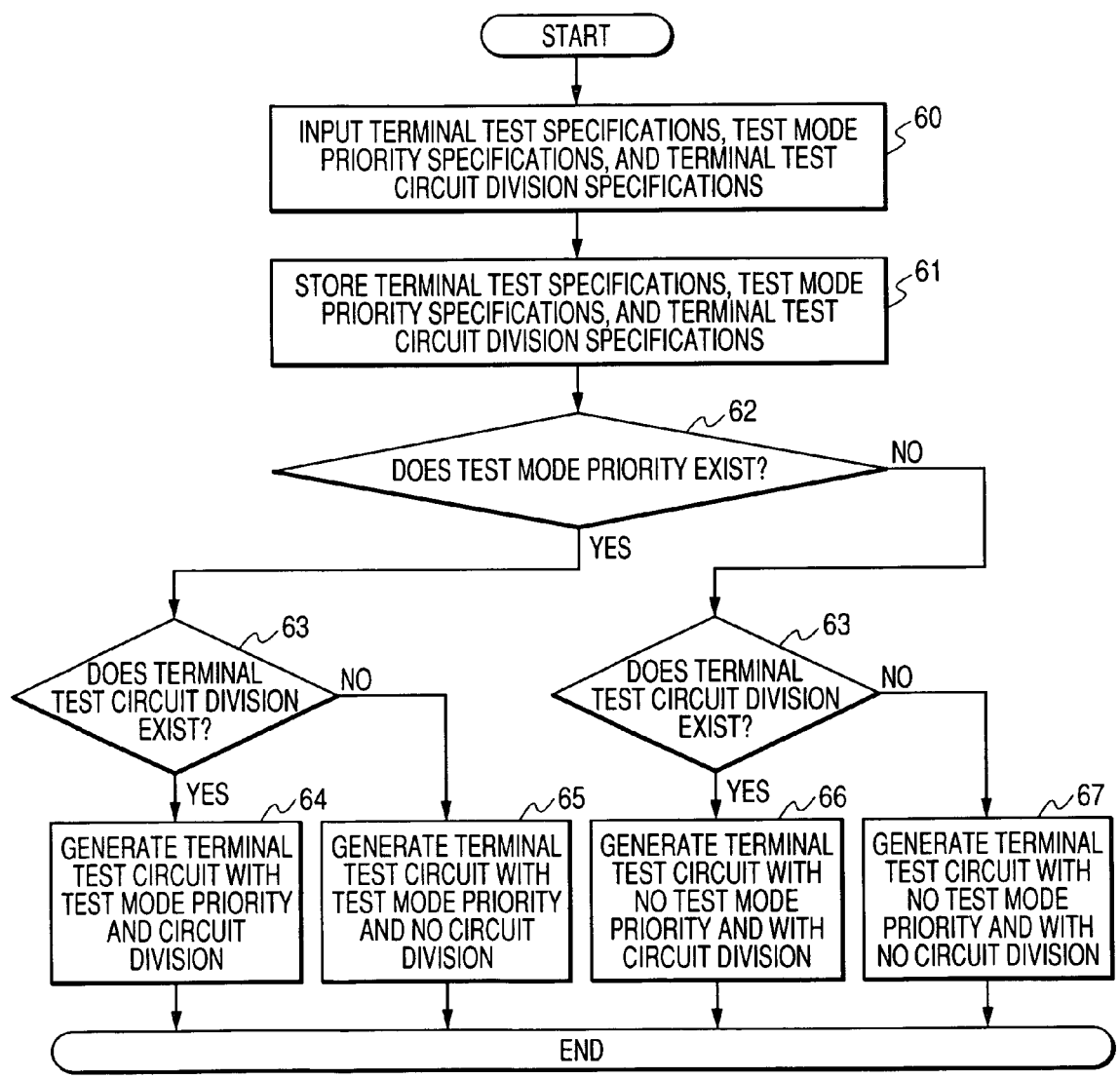
FIG. 13 is a flowchart to show the processing process of a circuit automatic generation method in a twelfth embodiment of the invention.

FIG. 13 is a flowchart to show the basic concept of a circuit automatic generation method in a twelfth embodiment of the invention. The circuit automatic generation method of the embodiment is a method of configuring a data selection circuit considering test mode priority and dividing a terminal test circuit according to terminal test circuit division specifications, thereby automatically generating a circuit considering both the circuit configuration and physical placement.

In FIG. 13, input at an input process 60 are terminal test specifications for automatically generating a terminal test circuit for controlling each terminal to input or output in response to the test specifications and when the terminal is controlled to output, selecting an output signal from function circuit and outputting the signal to the terminal, test mode priority specifications for generating a terminal test circuit speeded up in response to the priority, and terminal test circuit division specifications for specifying the division specifications of a terminal test circuit to provide flexible physical placement.

At a storage step 61, all input data input at the input step 60 is stored. The subsequent processing is selected from among an automatic generation step of a terminal test circuit with test mode priority and circuit division 64, an automatic generation step of a terminal test circuit with test mode priority and no circuit division 65, an automatic generation step of a terminal test circuit with no test mode priority and with circuit division 66, and an automatic generation step of a terminal test circuit with no test mode priority and with no circuit division 67 according to the determination result combination of a test mode priority determination step 62 and a terminal test circuit division determination step 63, and a terminal test circuit is generated and is output.

According to the described configuration, the configuration of the data selection circuit is considered so as not to worsen the AC timing in the usual mode by assigning the priority to the test modes, the terminal test circuit is divided as desired for enhancing the flexibility of the physical placement, and each divided terminal test circuit is placed in the proximity of the relevant terminal, so that the terminal test circuit considering the AC timing can be generated from both the circuit configuration and physical placement.

Thirteenth Embodiment

Figure 14:
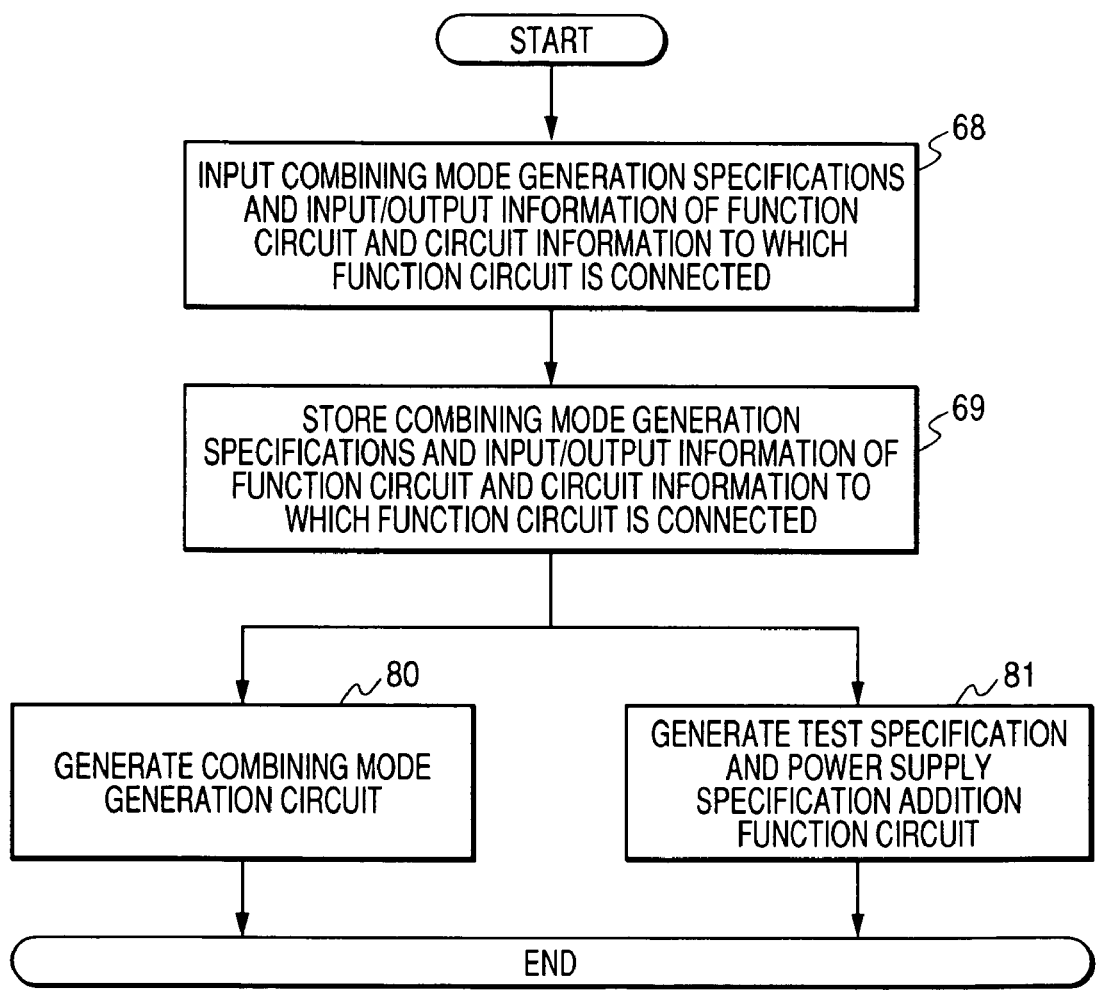
FIG. 14 is a flowchart to show the processing process of a circuit automatic generation method in a thirteenth embodiment of the invention.

FIG. 14 is a flowchart to show the basic concept of a circuit automatic generation method in a thirteenth embodiment of the invention. The circuit automatic generation method of the embodiment is a method of automatically generating a combining mode generation circuit and a test specification and power supply specification addition function circuit in response to combining mode generation specifications and input/output information of function circuit and circuit information to which function circuit is connected as with the fifth embodiment.

In FIG. 14, combining mode generation specifications and input/output information of function circuit and circuit information to which function circuit is connected are input at an input step 68.

In a storage step 69, the combining mode generation specifications and the input/output information of function circuit and circuit information to which function circuit is connected input at the input step 68 are stored. Then, at steps 80 and 81, a combining mode generation circuit and a test specification and power supply specification addition function circuit are automatically generated based on the HDL description syntax in response to the combining mode generation specifications.

According to the described configuration, the combining mode generation circuit and the test specification and power supply specification addition function circuit with the integrity of the top-layer circuit information kept can be automatically generated.

Fourteenth Embodiment

Figure 15:
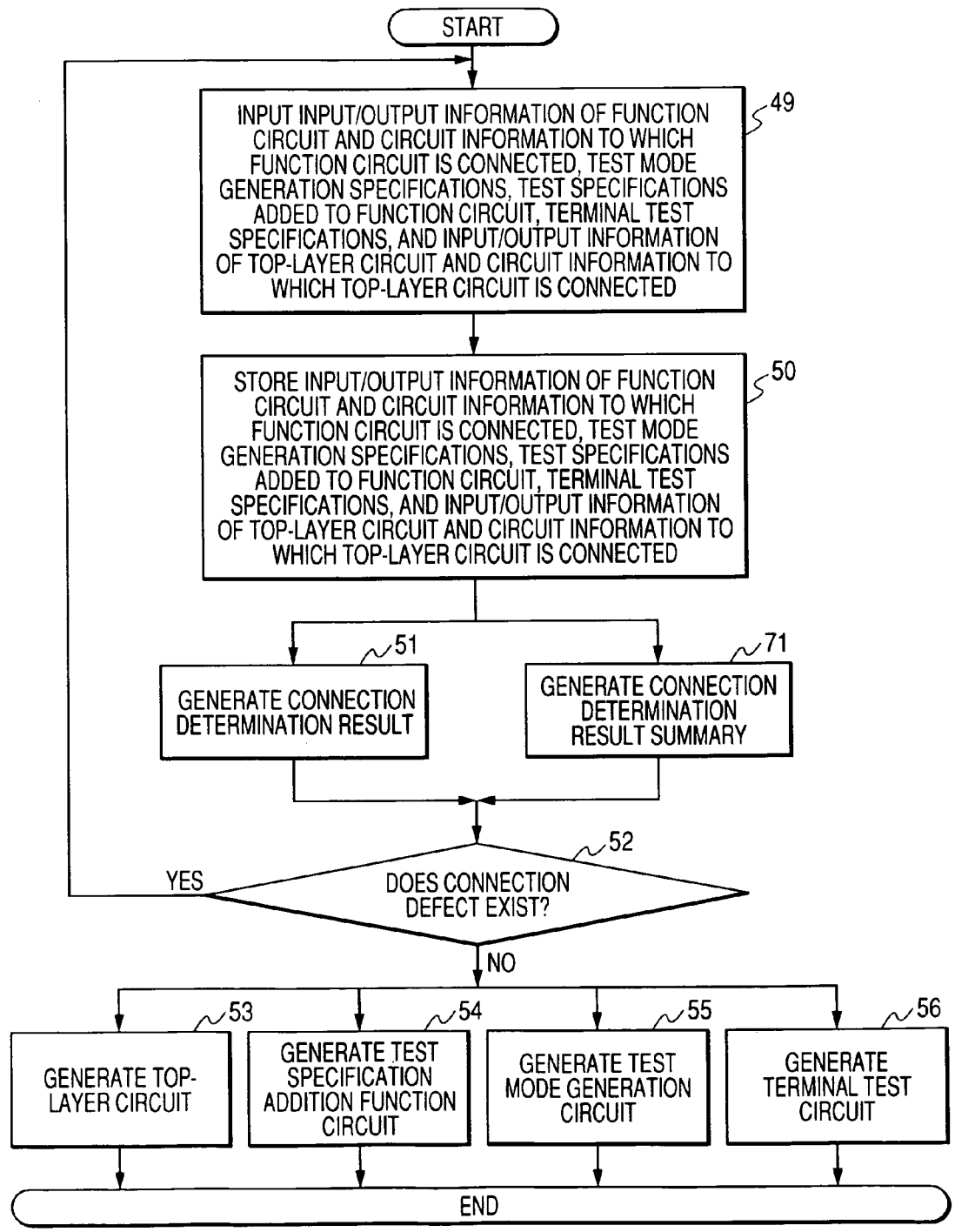
FIG. 15 is a flowchart to show the processing process of a circuit automatic generation method in a fourteenth embodiment of the invention.

FIG. 15 is a flowchart to show the basic concept of a circuit automatic generation method in a fourteenth embodiment of the invention. The circuit automatic generation method of the embodiment is a method of automatically inputting generation specifications of a test mode signal for controlling a semiconductor integrated circuit, terminal test specifications for controlling terminals by a test mode signal, input/output information of function circuit and circuit information to which function circuit is connected, test specifications added to each function circuit, and input/output information of the top-layer circuit and circuit information to which the top-layer circuit is connected to an input section, thereby determining the presence or absence of a connection defect of a top-layer circuit and outputting the connection determination result for each function circuit and a connection determination result summary of each function circuit.

In FIG. 15, input at an input step 49 are test mode generation specifications for generating a test mode signal for controlling the terminals and internal circuit of semiconductor integrated circuit at least in two states or more, terminal test specifications for automatically generating a terminal test circuit for controlling each terminal to input or output in response to the test specifications and when the terminal is controlled to output, selecting an output signal from function circuit and outputting the signal to the terminal, input/output information of one or more function circuits existing on the layer just below the top layer and circuit information to which each of the one or more function circuits are connected, function circuit test specifications for controlling the input/output information signal of function circuit at the test time, and input/output information of top-layer circuit and circuit information to which top-layer circuit is connected.

At a storage step 50, all input data input at the input step 49 is stored. At a connection determination result generation step 51 and a connection determination result summary generation step 71, the stored data is referenced, the signal connection relationship of the top-layer circuit is collated, the presence or absence of a connection defect of the top-layer circuit is determined, and the connection determination result for each function circuit and a connection determination result summary are output. If the output connection determination result indicates a defect, an input information connection error, etc., is eliminated by correction based on the connection determination result.

After the correction, again the connection information determination result is generated at the connection information determination result generation step 51 and the connection determination result summary generation step 71. As soon as the connection information determination result does not involve any problem, at a top-layer circuit generation step 53 of generating a top-layer circuit, a test specification addition function circuit generation step 54 of generating a function circuit to which test specification are added, a test mode generation circuit generation step 55 of generating a test mode generation circuit, and a terminal test circuit generation step 56 of generating a terminal test circuit, a top-layer circuit, a test specification addition function circuit, a test mode generation circuit, and a terminal test circuit are automatically generated and are output.

According to the described configuration, the means for making it possible to check both a connection determination result summary and the connection determination result for each function circuit is provided, whereby the correction efficiency is enhanced and the top-layer circuit free of a connection error, etc., can be generated in the shortest time.

Fifteenth Embodiment

Figure 16:
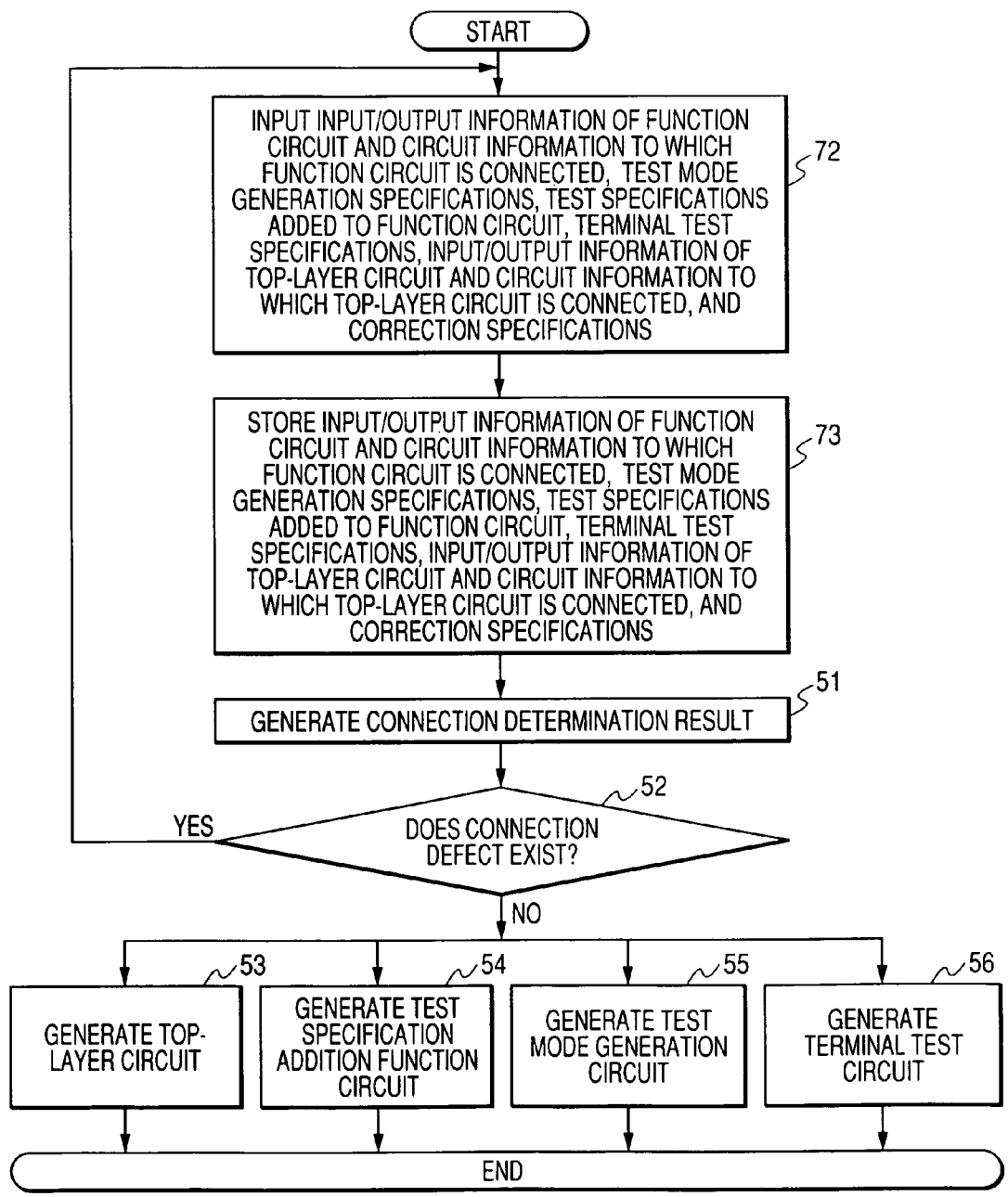
FIG. 16 is a flowchart to show the processing process of a circuit automatic generation method in a fifteenth embodiment of the invention.

FIG. 16 is a flowchart to show the basic concept of a circuit automatic generation method in a fifteenth embodiment of the invention. The circuit automatic generation method of the embodiment is a method of automatically generating a top-layer circuit in response to correction specifications based on the HDL description syntax by inputting correction specifications together with input/output information of top-layer circuit and circuit information to which top-layer circuit is connected if test mode generation specifications, terminal test specifications, input/output information of function circuit and circuit information to which function circuit is connected, test specifications added to function circuit, etc., input to an input section cannot be updated because of the design policy, etc.

In FIG. 16, input at an input step 72 are test mode generation specifications, terminal test specifications, input/output information of function circuit and circuit information to which function circuit is connected, and test specifications added to function circuit as with the tenth embodiment. At the same time, correction specifications and input/output information of top-layer circuit and circuit information to which top-layer circuit is connected are also input at the input step 72.

At a storage step 73, all input data input at the input step 72 is stored. At a connection information determination result generation step 51, the stored data is referenced, the signal connection relationship of the top-layer circuit is collated, the presence or absence of a connection defect of the top-layer circuit is determined, and the connection determination result is output. If the output connection determination result indicates a defect, an input information connection error, etc., is eliminated by correction based on the connection determination result.

After the correction, again the connection information determination result is generated at the connection information determination result generation step 51. As soon as the connection information determination result does not involve any problem, at a top-layer circuit generation step 53 of generating a top-layer circuit, a test specification addition function circuit generation step 54 of generating a function circuit to which test specification are added, a test mode generation circuit generation step 55 of generating a test mode generation circuit, and a terminal test circuit generation step 56 of generating a terminal test circuit, a top-layer circuit, a test specification addition function circuit, a test mode generation circuit, and a terminal test circuit are automatically generated and are output.

In the top-layer circuit automatic generation method of the embodiment, even if the original data cannot be corrected, the correction specifications are additionally input, whereby the corrected top-layer circuit can be generated automatically, and all information required for creating the top-layer circuit containing the test specifications is input data, so that integrity of circuit information (input/output information and circuit information to which circuit is connected) in the test mode generation circuit and the terminal test circuit newly created according to the test specifications and the test specification addition function circuit converted according to the test specifications is kept.

Since the input data is corrected according to the connection determination result, a connection mistake can be corrected before the circuit is automatically generated and the top-layer circuit free of a connection error, etc., can be generated in the shortest time.

Sixteenth Embodiment

Figure 17:
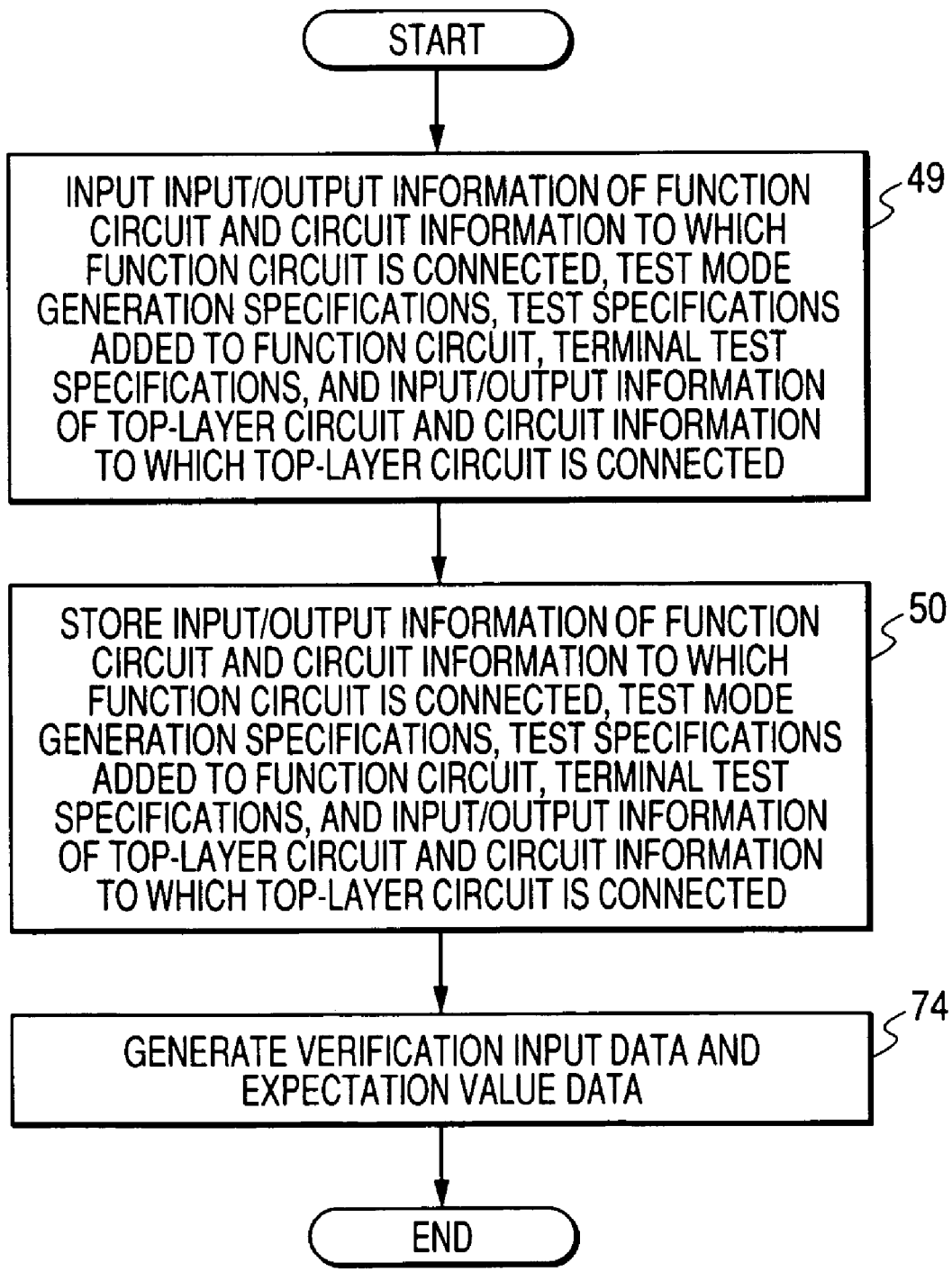
FIG. 17 is a flowchart to show the processing process of a circuit automatic generation method in a sixteenth embodiment of the invention.

FIG. 17 is a flowchart to show the basic concept of a circuit automatic generation method in a sixteenth embodiment of the invention. The circuit automatic generation method of the embodiment is a method of automatically generating input data and expectation value data to verify a semiconductor integrated circuit by inputting generation specifications of a test mode signal for controlling a semiconductor integrated circuit, terminal test specifications for controlling terminals by a test mode signal, input/output information of function circuit and circuit information to which function circuit is connected, test specifications added to each function circuit, and input/output information of the top-layer circuit and circuit information to which the top-layer circuit is connected to an input section.

In FIG. 17, input at an input step 49 are test mode generation specifications for generating a test mode signal for controlling the terminals and internal circuit of semiconductor integrated circuit at least in two states or more, terminal test specifications for automatically generating a terminal test circuit for controlling each terminal to input or output in response to the test specifications and when the terminal is controlled to output, selecting an output signal from function circuit and outputting the signal to the terminal, input/output information of one or more function circuits existing on the layer just below the top layer and circuit information to which each of the one or more function circuits are connected, function circuit test specifications for controlling the input/output information signal of function circuit at the test time, and input/output information of top-layer circuit and circuit information to which top-layer circuit is connected.

At a storage step 50, all input data input at the input step 49 is stored. At a verification input data and expectation value data generation step 74, the stored data is referenced and the verification input data and the verification expectation value data can be generated in a short time.

Seventeenth Embodiment

FIG. 18 is a flowchart to show the basic concept of a circuit automatic generation method in a seventeenth embodiment of the invention. The circuit automatic generation method of the embodiment is a method of automatically generating a black box circuit based on the HDL description syntax to verify a semiconductor integrated circuit by inputting input/output information of function circuit and circuit information to which function circuit is connected and test specifications added to each function circuit to an input section.

In FIG. 18, at an input step 75, the input/output information of function circuit and circuit information to which function circuit is connected and the function circuit test specifications are input.

At a storage step 76, the input/output information of function circuit and circuit information to which function circuit is connected and the function circuit test specifications input at the input step 75 are stored and at step 75, a black box circuit is generated based on the HDL description syntax.

According to the described configuration, a function circuit to which function verification is not applied can be easily put into a black box in response to the function verification item, so that the function verification time can be reduced.

In the circuit automatic generation apparatus and method of the invention, all information required for creating the top-layer circuit containing the test relevant specifications is given, so that integrity of circuit information in the test mode generation circuit and the terminal test circuit newly created according to the test specifications and the function circuit to which the test specifications are added is kept and a large number of design steps are unified. Thus, the problems in the related arts can be solved and the connection information is checked simply by inputting the circuit specifications and then the top-layer circuit free of a connection error, etc., is automatically generated in a short time, so that long-hour work and waste of a great deal of time as manual return is repeated in the design steps in the related arts can be circumvented and a high-quality product can be designed efficiently. The circuit automatic generation apparatus and method of the invention are useful as the circuit automatic generation apparatus and method and the like relating to the automatic design technology of a semiconductor integrated circuit described in the HDL (Hardware Description Language) and particularly unifying a large number of design steps required for creating the top-layer circuit of a semiconductor integrated circuit.

What is claimed is:

1. A circuit automatic generation apparatus of a semiconductor integrated circuit for connecting signals of a plurality of function circuits to generate a top-layer circuit, the circuit automatic generation apparatus comprising:

means for retaining data, wherein the data comprises input/output information of each of the function circuits and circuit information to which each of the function circuits is connected, test mode generation specifications for generating a test mode signal to identify a plurality of operation modes containing the usual operation time and the test operation time, test specifications added to each of the function circuits, terminal test specifications for specifying input/output directions of terminals and circuit terminal information to which the terminals are connected in response to the test mode signal, input/output information of the top-layer circuit and circuit information to which the top-layer circuit is connected, and combining mode generation specification of combining power supply control specification for specifying a power supply control method to semiconductor elements for each of power supply channels into which one power supply channel is divided;

means for collating the connecting signals of each function circuit based on the retained data and determining the presence or absence of a connection defect;

means for making a correction to the retained data when collating determines the presence of a connection defect;

means for generating a test mode generation circuit in response to the test mode generation specifications;

means for generating a function circuit to which test specifications are added in response to the test specifications added to the function circuit;

means for generating a terminal test circuit in response to the terminal test specifications;

means for generating the top-layer circuit from the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected;

means for generating a combining mode generation circuit in response to the combining mode generation specification;

means for generating a test specification and power supply specification addition circuit from the combining mode generation specification and the input/output information of the function circuit and circuit information to which the function circuit is connected; and wherein the top-layer circuit of a hierarchical design is described in a hardware description language.

2. The circuit automatic generation apparatus as claimed in claim 1, further comprising means for retaining terminal test circuit division specifications for specifying a division method of the terminal test circuit, wherein the means for generating a terminal test circuit generates terminal test circuits into which one terminal test circuit is divided in response to the terminal test specifications and the terminal test circuit division specifications.

3. The circuit automatic generation apparatus as claimed in claim 1 wherein the means for collating the signal connection relationship of the function circuit and determining the presence or absence of a connection defect generates the determination result of the presence or absence of a connection defect and a connection determination result summary as a summary of the determination result of the presence or absence of a connection defect for each function circuit.

4. The circuit automatic generation apparatus as claimed in claim 1, further comprising:

means for retaining added specifications describing corrections to be made to the input/output information of the function circuit and circuit information to which the function circuit is connected, the test mode generation specifications, the test specifications added to the function circuit, and the terminal test specifications, wherein the means for generating the top-layer circuit generates the top-layer circuit from the test mode generation specifications, the terminal test specifications, the input/output information of the function circuit and circuit information to which the function circuit is connected, the test specifications added to the function circuit, the input/output information of the top-layer circuit and circuit information to which the top-layer circuit is connected, and the added specifications.

5. The circuit automatic generation apparatus as claimed in claim 1, further comprising means for automatically generating input data and expectation value data to verify the semiconductor integrated circuit in response to the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

6. The circuit automatic generation method as claimed in claim 1 further comprising means for generating a black box circuit to which function verification is not applied when the semiconductor integrated circuit is verified in response to the input/output information of the function circuit and circuit information to which the function circuit is connected and the test specifications added to the function circuit.

7. The circuit automatic generation apparatus as claimed in claim 1 further comprising means for retaining test mode priority specifications for specifying the priority of the operation modes, wherein
when configuring a selection circuit of a signal output to the terminal, the means for generating a terminal test circuit configures the selection circuit so that circuits become higher-speed circuits in the descending order of the priority levels of the operation modes from the high priority to the low priority.

8. A circuit automatic generation method of a semiconductor integrated circuit for connecting signals of a plurality of function circuits to generate a top-layer circuit, the circuit automatic generation method comprising the steps of:
retaining data, wherein the data comprises input/output information of each of the function circuits and circuit information to which each of the function circuits is connected, test mode generation specifications for generating a test mode signal to identify a plurality of operation modes containing the usual operation time and the test operation time, test specifications added to each of the function circuits, terminal test specifications for specifying input/output directions of terminals and circuit terminal information to which the terminals are connected in response to the test mode signal, input/output information of the top-layer circuit and circuit information to which the top-layer circuit is connected, and combining mode generation specification of combining power supply control specification for specifying a power supply control method to semiconductor elements for each of power supply channels into which one power supply channel is divided;
collating the signal connection relationship of the function circuit based on the retained data and determining the presence or absence of a connection defect;
making a correction to the retained data when collating determines the presence of a connection defect;
generating a test mode generation circuit in response to test mode generation specifications;
generating a function circuit to which test specifications are added in response to the test specifications added to the function circuit;
generating a terminal test circuit in response to terminal test specifications;
generating, by using a processor, the top-layer circuit from the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected;
generating a combining mode generation circuit in response to the combining mode generation specification;
generating a test specification and power supply specification addition circuit from the combining mode generation specification and the input/output information of the function circuit and circuit information to which the function circuit is connected; and
wherein the top-layer circuit of a hierarchical design is described in a hardware description language.

9. The circuit automatic generation method as claimed in claim 8 further comprising the step of inputting terminal test circuit division specifications for specifying a division method of the terminal test circuit, wherein
the step of generating a terminal test circuit generates terminal test circuits into which one terminal test circuit is divided in response to the terminal test specifications and the terminal test circuit division specifications.

10. The circuit automatic generation method as claimed in claim 8 wherein the step of collating the signal connection relationship of the function circuit and determining the presence or absence of a connection defect generates the determination result of the presence or absence of a connection defect and a connection determination result summary as a summary of the determination result of the presence or absence of a connection defect for each function circuit.

11. The circuit automatic generation method as claimed in claim 8 further comprising the step of inputting added specifications describing corrections to be made to the input/output information of the function circuit and circuit information to which the function circuit is connected, the test mode generation specifications, the test specifications added to the function circuit, and the terminal test specifications, wherein
the step of generating the top-layer circuit generates the top-layer circuit from the test mode generation specifications, the terminal test specifications, the input/output information of the function circuit and circuit information to which the function circuit is connected, the test specifications added to the function circuit, the input/output information of the top-layer circuit and circuit information to which the top-layer circuit is connected, and the added specifications describing the corrections to be made to the input/output information of the function circuit and circuit information to which the function circuit is connected, the test mode generation specifications, the test specifications added to the function circuit, and the terminal test specifications.

12. The circuit automatic generation method as claimed in claim 8 further comprising the step of generating input data and expectation value data to verify the semiconductor integrated circuit in response to the test mode generation specifications, the terminal test specifications, the input/output information of the function circuit and circuit information to which the function circuit is connected, the test specifications added to the function circuit, and the input/output information of the top-layer circuit and circuit information to which the top-layer circuit is connected.

13. The circuit automatic generation method as claimed in claim 8 further comprising the step of generating a black box circuit to which function verification is not applied when the semiconductor integrated circuit is verified in response to the input/output information of the function circuit and circuit information to which the function circuit is connected and the test specifications added to the function circuit.

14. The circuit automatic generation method as claimed in claim 8, further comprising the step of inputting test mode priority specifications for specifying the priority of the operation modes, wherein when configuring a selection circuit of a signal output to the terminal, the step of generating a terminal test circuit configures the selection circuit so that circuits become higher-speed circuits in the descending order of the priority levels of the operation modes from the high priority to the low priority.

* * * * *